United States Patent
Lee et al.

(10) Patent No.: US 12,328,923 B2
(45) Date of Patent: Jun. 10, 2025

(54) GATE ELECTRODE DEPOSITION AND STRUCTURE FORMED THEREBY

(71) Applicant: Taiwan Semiconductor Manufacturing Co., Ltd., Hsinchu (TW)

(72) Inventors: Hsin-Yi Lee, Hsinchu (TW); Cheng-Lung Hung, Hsinchu (TW); Chi On Chui, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 186 days.

(21) Appl. No.: 18/079,171

(22) Filed: Dec. 12, 2022

(65) Prior Publication Data

US 2023/0115763 A1    Apr. 13, 2023

Related U.S. Application Data

(63) Continuation of application No. 17/078,655, filed on Oct. 23, 2020, now Pat. No. 11,527,621.

(60) Provisional application No. 63/061,349, filed on Aug. 5, 2020.

(51) Int. Cl.
| | |
|---|---|
| H01L 21/8238 | (2006.01) |
| H10D 30/01 | (2025.01) |
| H10D 30/62 | (2025.01) |
| H10D 64/01 | (2025.01) |
| H10D 64/66 | (2025.01) |
| H10D 84/01 | (2025.01) |
| H10D 84/03 | (2025.01) |
| H10D 84/85 | (2025.01) |

(52) U.S. Cl.
CPC ........... *H10D 64/01* (2025.01); *H10D 30/024* (2025.01); *H10D 30/62* (2025.01); *H10D 64/017* (2025.01); *H10D 64/667* (2025.01); *H10D 84/0177* (2025.01); *H10D 84/0186* (2025.01); *H10D 84/0193* (2025.01); *H10D 84/038* (2025.01); *H10D 84/853* (2025.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |

(Continued)

FOREIGN PATENT DOCUMENTS

| | | |
|---|---|---|
| DE | 102016115983 A1 | 5/2017 |
| KR | 20170059247 A | 5/2017 |
| KR | 20190032213 A | 3/2019 |

*Primary Examiner* — Joseph C. Nicely
*Assistant Examiner* — Lamont B Koo
(74) *Attorney, Agent, or Firm* — Slater Matsil, LLP

(57) ABSTRACT

A method includes depositing a first work function tuning layer over a gate dielectric layer using an atomic layer deposition process. The atomic layer deposition process comprises depositing one or more first nitride monolayers; and depositing one or more carbide monolayers over the one or more first nitride monolayers. The method further includes depositing an adhesion layer of the first work function tuning layer; and depositing a conductive material over the adhesion layer.

20 Claims, 24 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,157,746 B2 | 12/2018 | Hsieh |
| 2005/0233527 A1 | 10/2005 | Brask et al. |
| 2006/0121678 A1 | 6/2006 | Brask et al. |
| 2006/0121727 A1 | 6/2006 | Metz et al. |
| 2008/0054330 A1 | 3/2008 | Forbes et al. |
| 2010/0140717 A1 | 6/2010 | Lavoie et al. |
| 2011/0263115 A1 | 10/2011 | Ganguli et al. |
| 2012/0309181 A1 | 12/2012 | Machkaoutsan et al. |
| 2013/0270617 A1 | 10/2013 | Lin et al. |
| 2014/0319626 A1 | 10/2014 | Jangjian et al. |
| 2015/0035073 A1 | 2/2015 | Ando et al. |
| 2015/0262828 A1 | 9/2015 | Brand et al. |
| 2016/0181163 A1 | 6/2016 | Huang et al. |
| 2016/0190305 A1 | 6/2016 | JangJian et al. |
| 2016/0322471 A1 | 11/2016 | JangJian et al. |
| 2017/0148792 A1 | 5/2017 | Kim et al. |
| 2019/0088555 A1 | 3/2019 | Xie et al. |
| 2019/0096681 A1 | 3/2019 | Wei et al. |
| 2019/0131418 A1 | 5/2019 | Ando et al. |

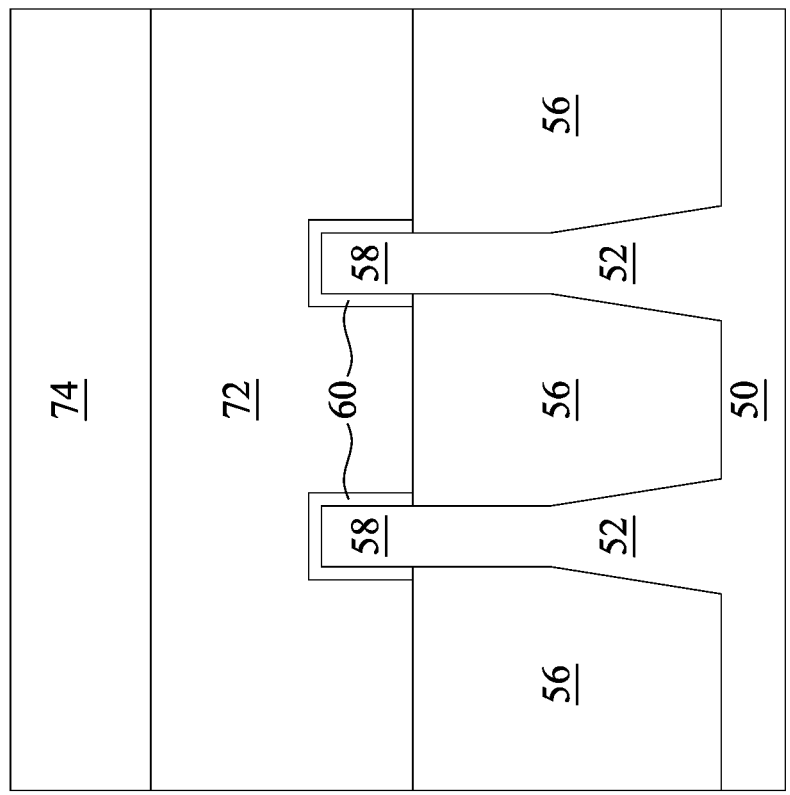
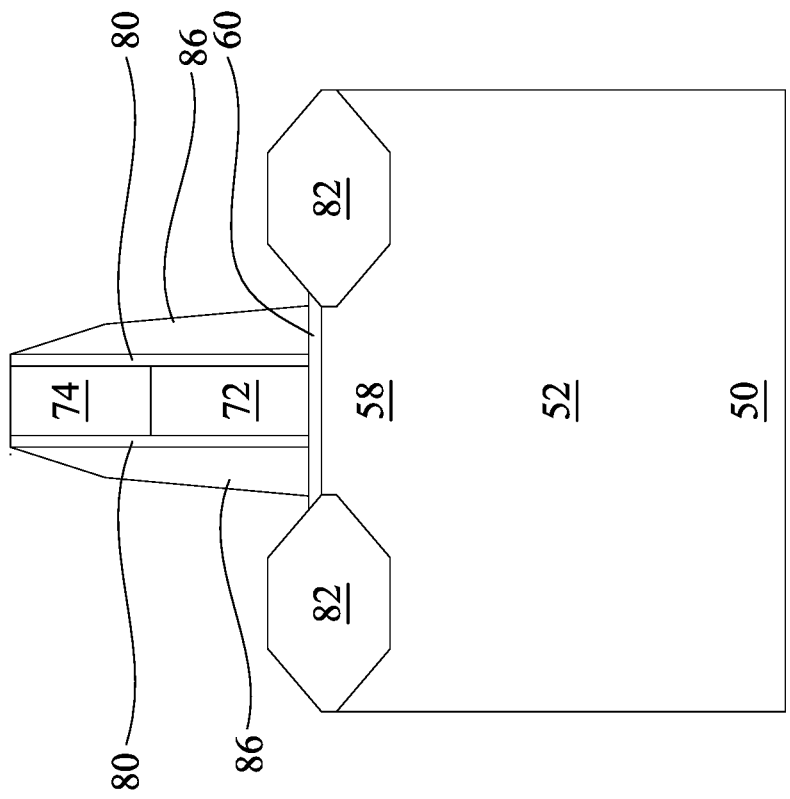
Fig. 10A
Fig. 10B

GATE ELECTRODE DEPOSITION AND STRUCTURE FORMED THEREBY

PRIORITY CLAIM AND CROSS-REFERENCE

This application is a continuation of U.S. application Ser. No. 17/078,655, filed Oct. 23, 2020, which claims the benefit of U.S. Provisional Application No. 63/061,349, filed on Aug. 5, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 14C, 15A, 15B, 15C, 15D, 17A, 17B, 18A, and 18B are cross-sectional views of intermediate stages in the manufacturing of FinFETs, in accordance with some embodiments.

DETAILED DESCRIPTION

Figure 1:
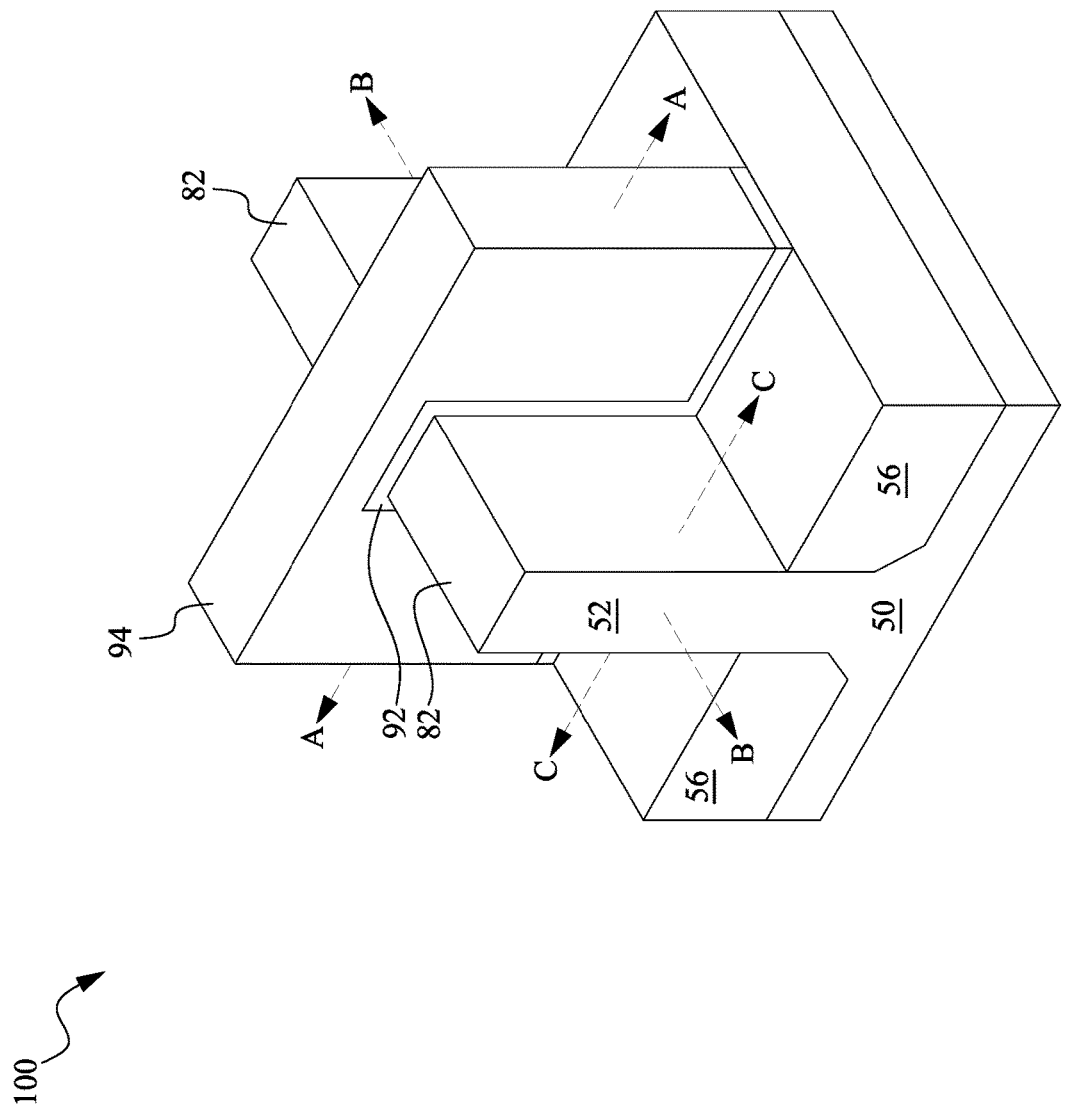
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a method of depositing a work function metal (WFM) layer of a gate electrode for improved work function tuning. In some embodiments, the WFM layer is a p-type layer that is formed by an atomic layer deposition (ALD) process. The ALD process may deposit a combination of nitride monolayers (e.g., titanium nitride, tantalum nitride, or the like) and carbide monolayers (e.g., titanium carbide, tantalum carbide, or the like). By adjusting the ratio of a quantity of carbide monolayers to a quantity of nitride monolayers that are deposited, a work function of the gate electrode can be more precisely tuned. For example, a higher ratio carbon to nitrogen in the WFM layer may result in a lower work function (e.g., more n-type), and a lower ratio of carbon to nitrogen in the WFM layer may result in a higher work function (e.g., more p-type).

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 18B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 17A, and 18A are illustrated along reference cross-section A-A illustrated in FIG. 1, and FIGS. 8B, 9B, 10B, 11B, 12B, 13B, 14B, 14C, 15A, 15B, 15C, 15D, 17B, and 18B are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs.

Figure 2:
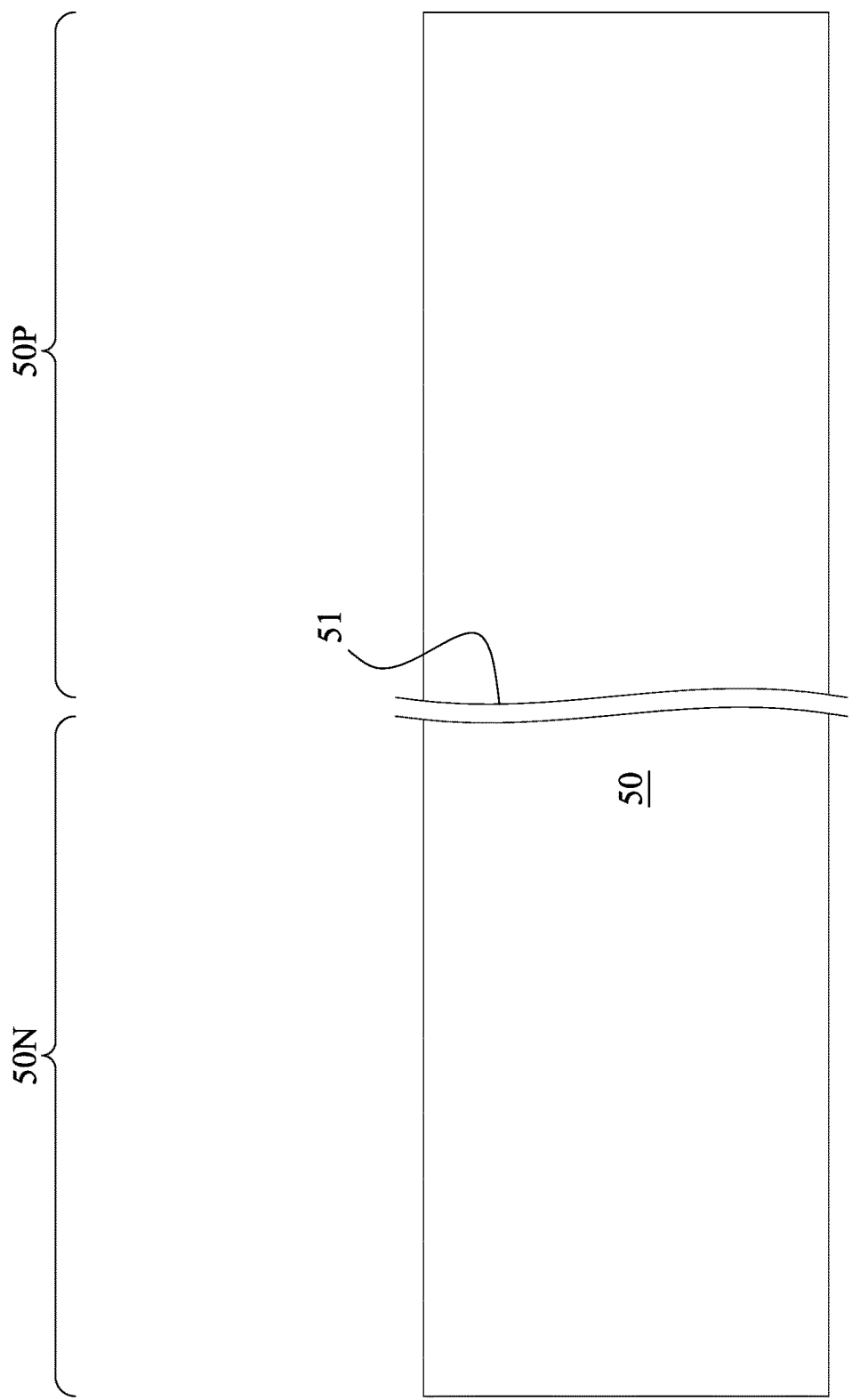

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
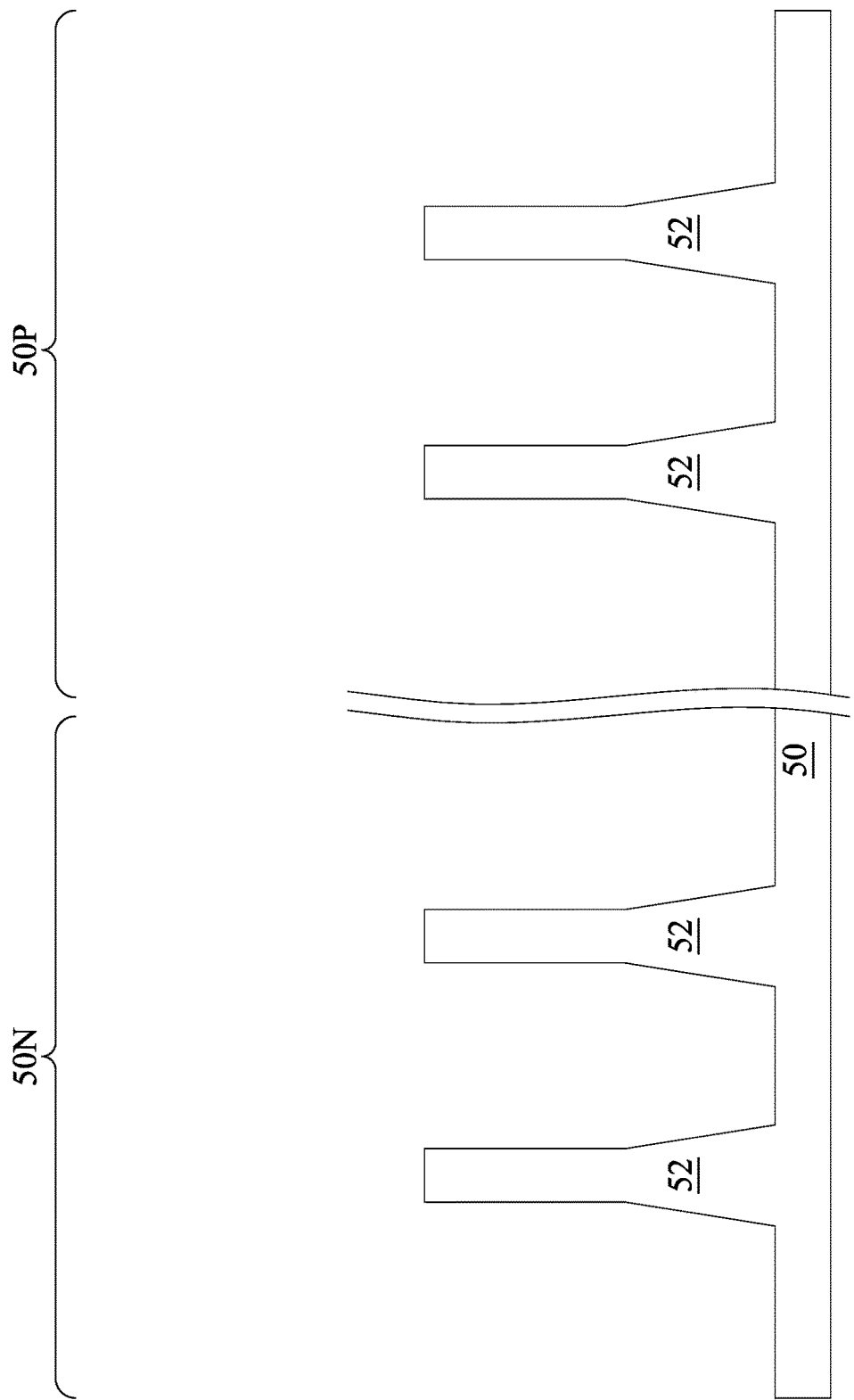

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
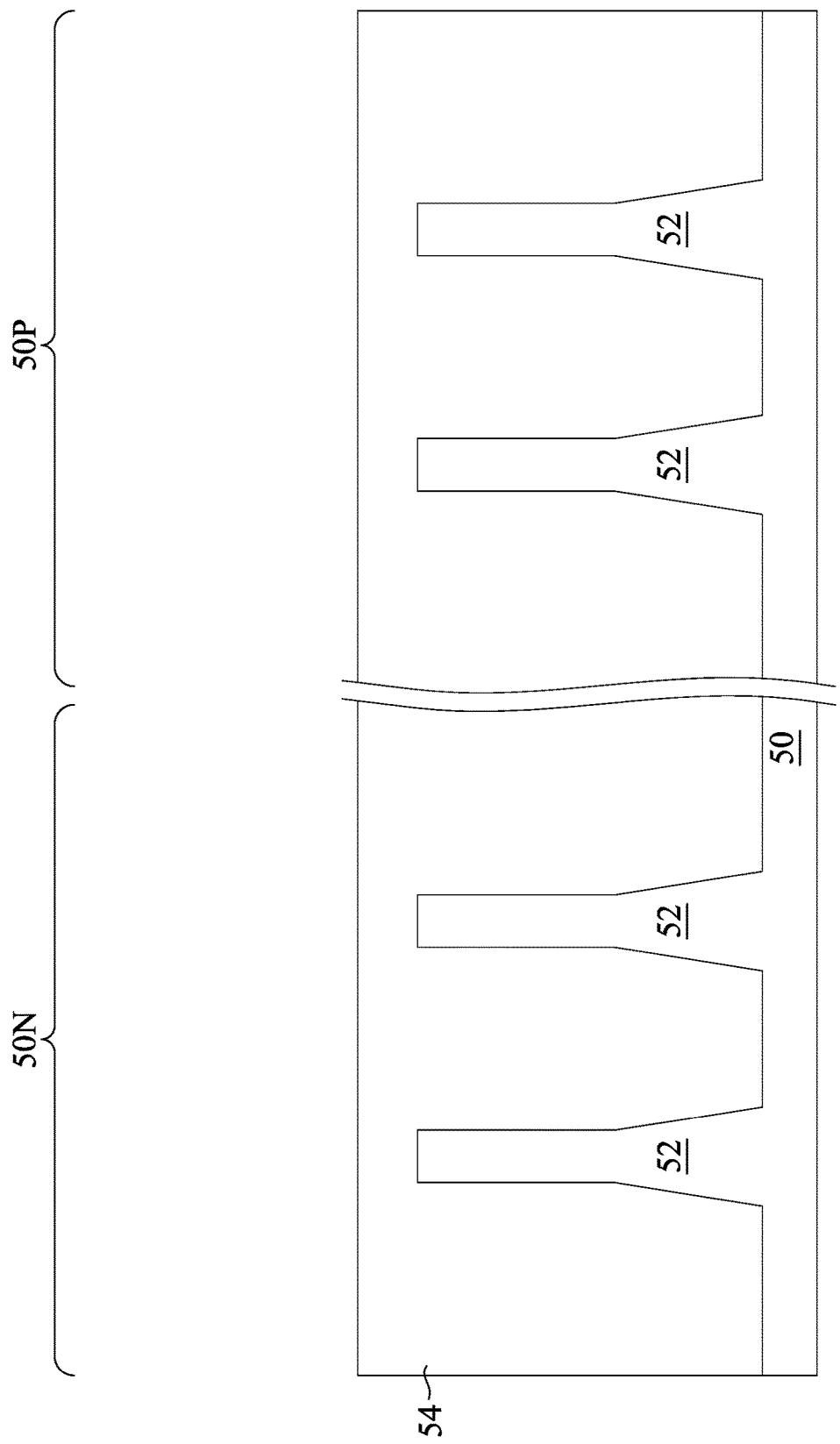

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
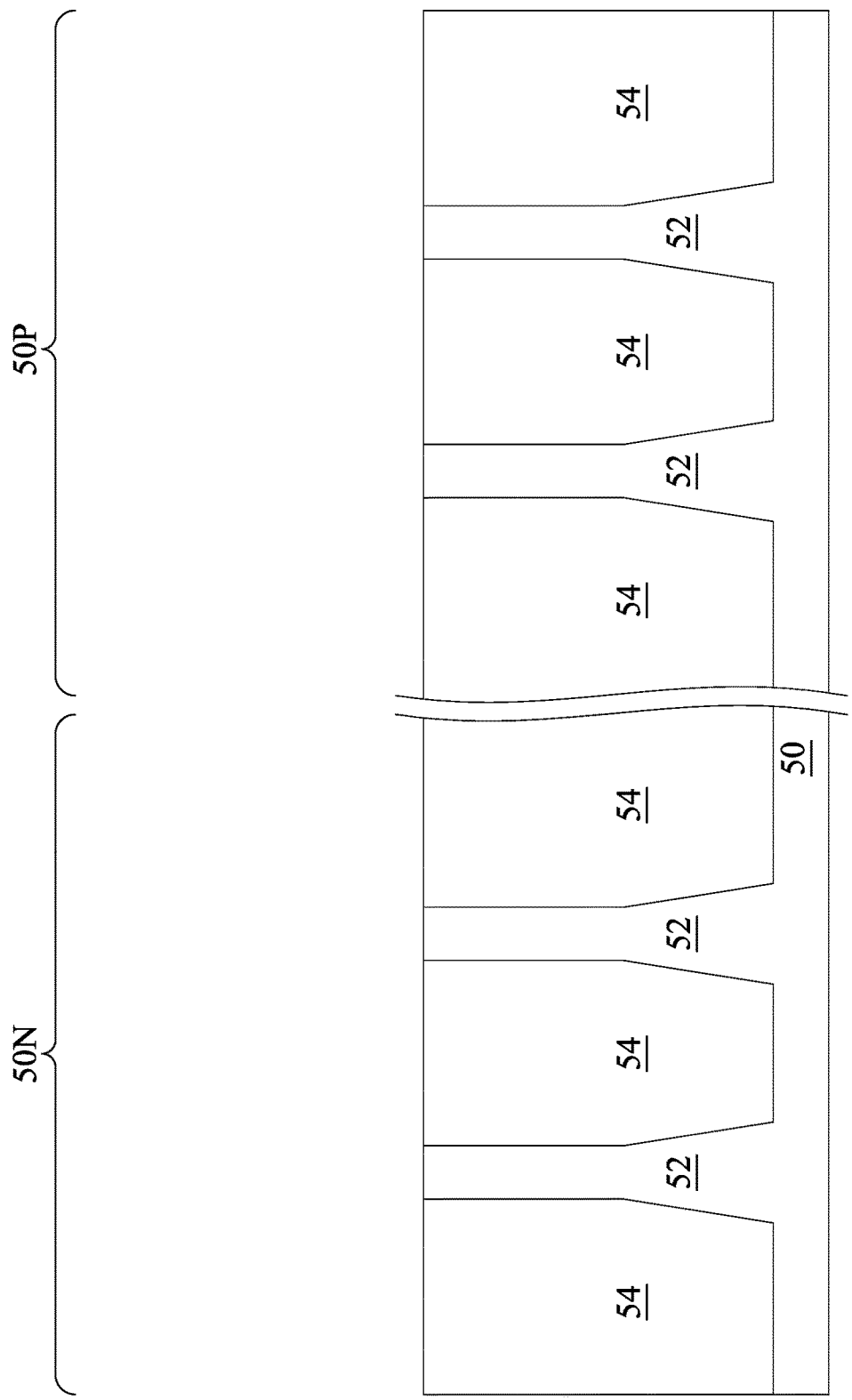

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
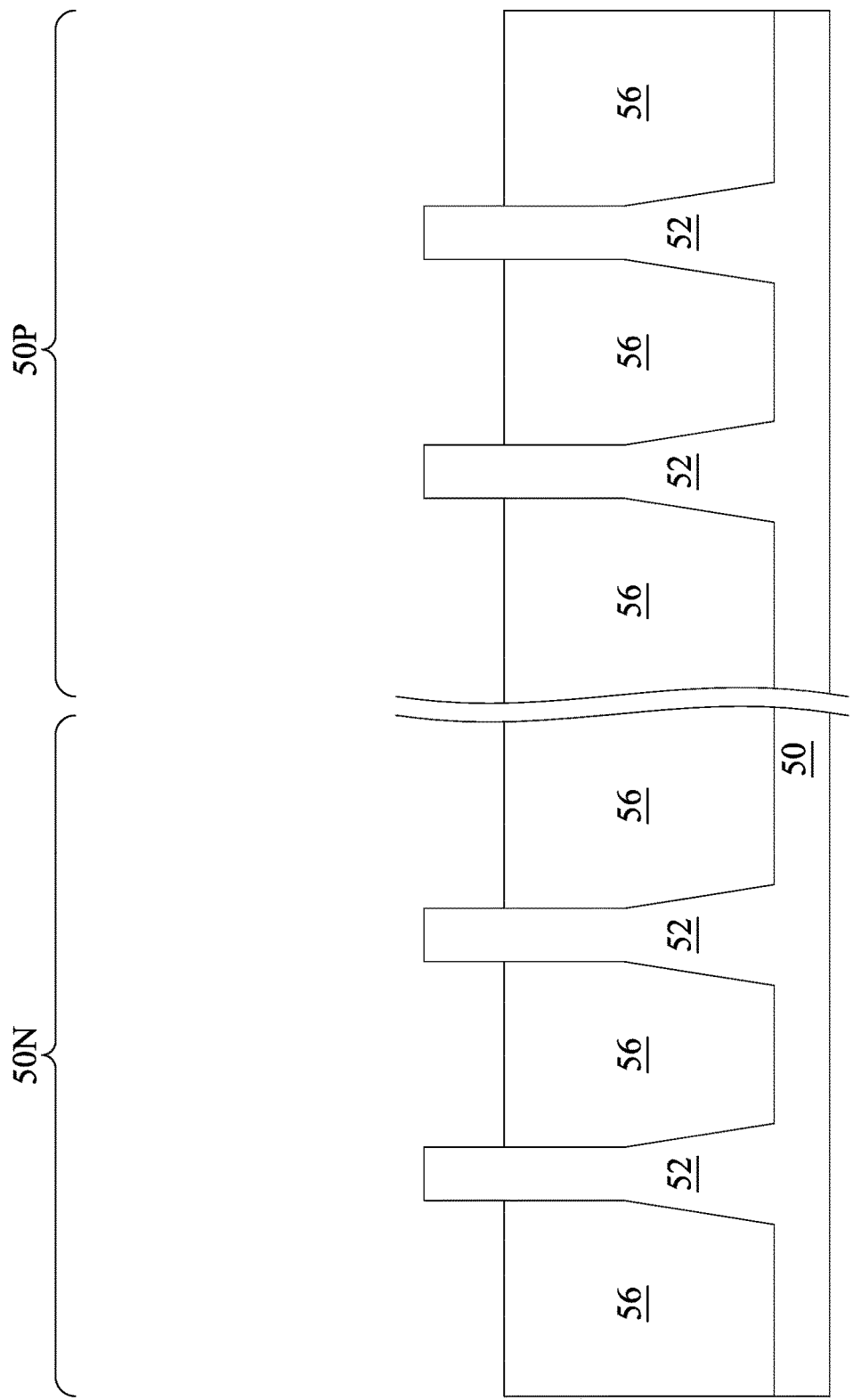

In FIG. 6, the insulation material 54 is recessed to form Shallow Trench Isolation (STI) regions 56. The insulation material 54 is recessed such that upper portions of fins 52 in the n-type region 50N and in the p-type region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in n-type region 50N (e.g., an NMOS region) different from the material in p-type region 50P (e.g., a PMOS region). In various embodiments, upper portions of the fins 52 may be formed from silicon-germanium ($Si_x Ge_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the STI regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the STI regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
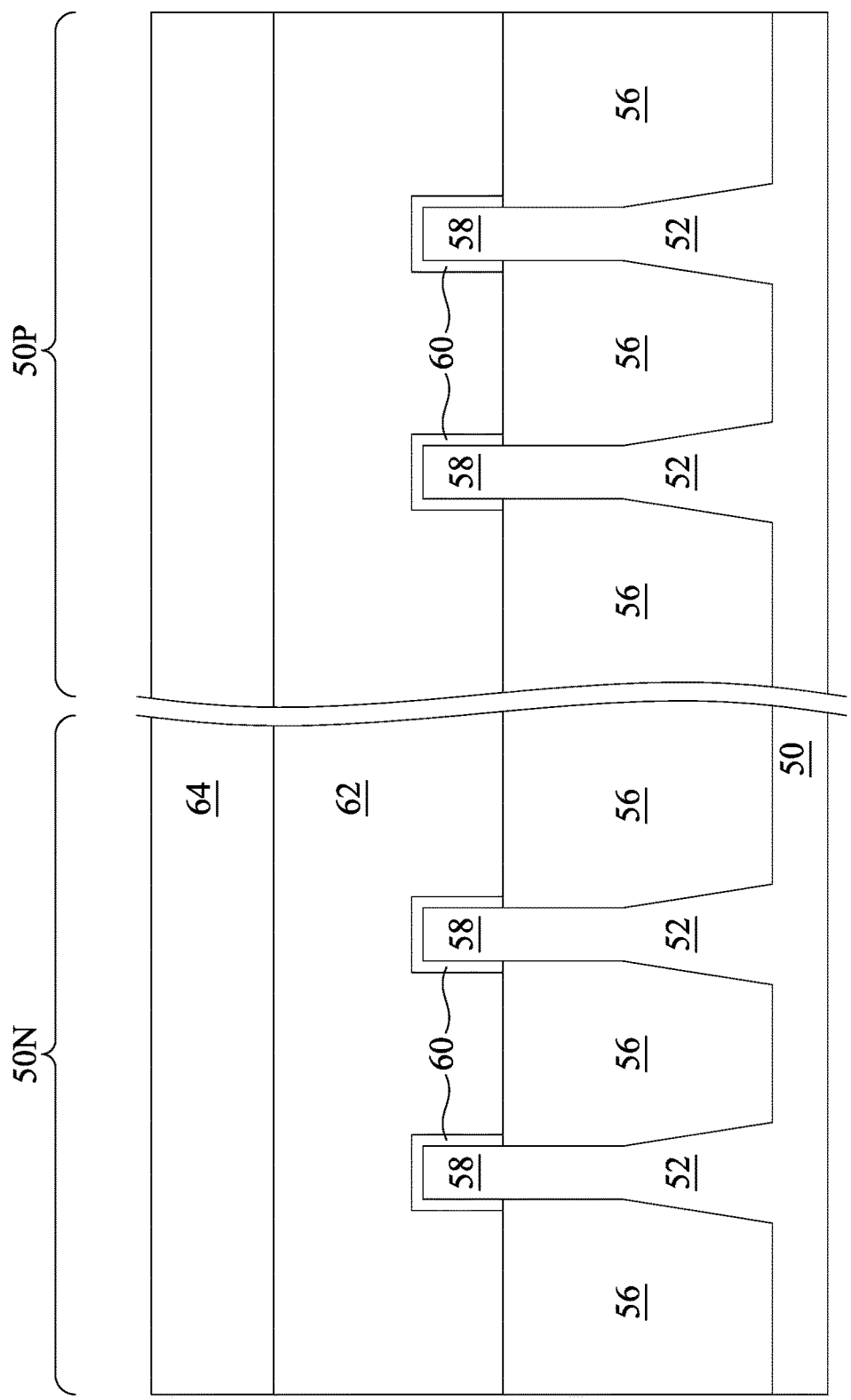

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the STI regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending over the STI regions and between the dummy gate layer 62 and the STI regions 56.

FIGS. 8A through 16B illustrate various additional steps in the manufacturing of embodiment devices. FIGS. 8A through 16B illustrate features in either of the n-type region 50N and the p-type region 50P. For example, the structures illustrated in FIGS. 8A through 16B may be applicable to both the n-type region 50N and the p-type region 50P. Differences (if any) in the structures of the n-type region 50N and the p-type region 50P are described in the text accompanying each figure.

Figure 8B:
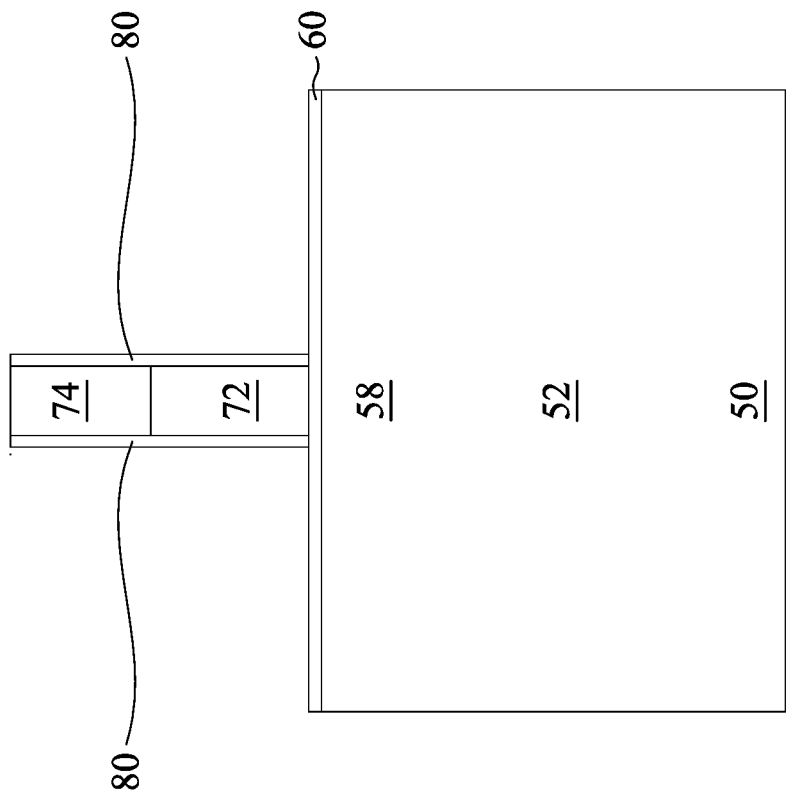
Figure 8A:
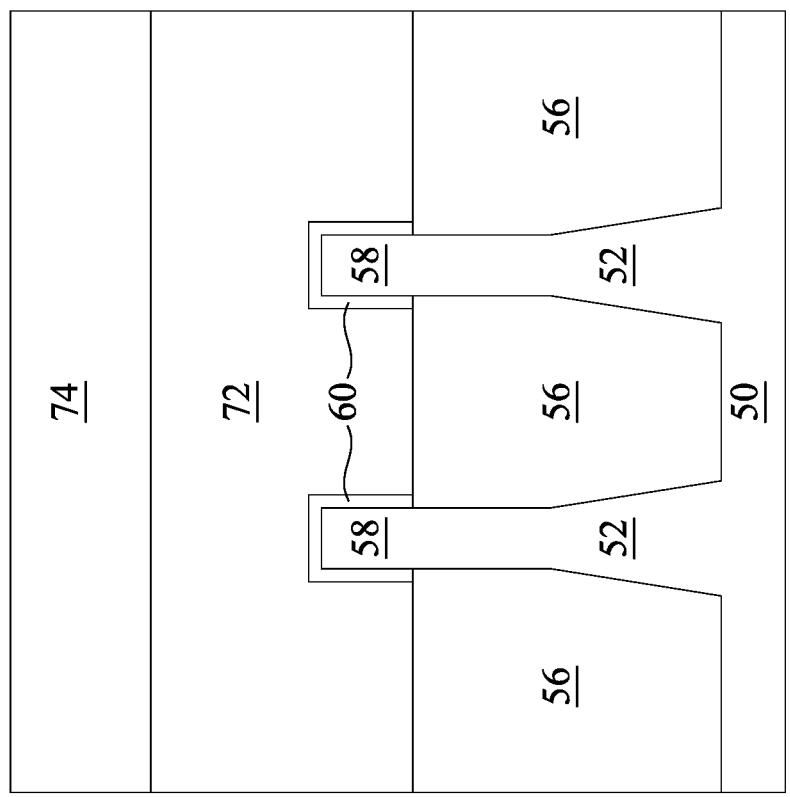

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
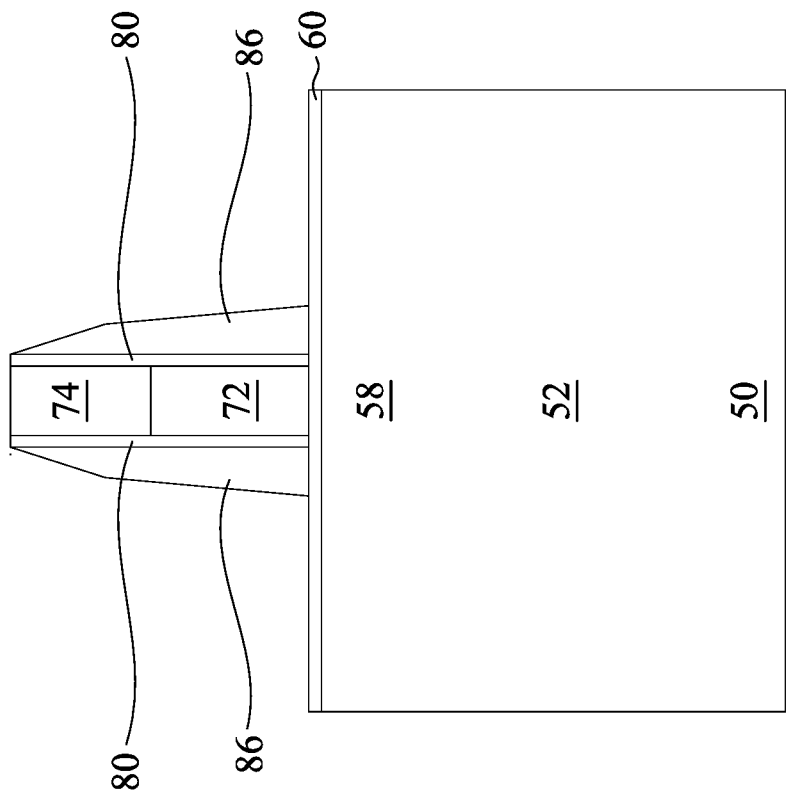
Figure 9A:
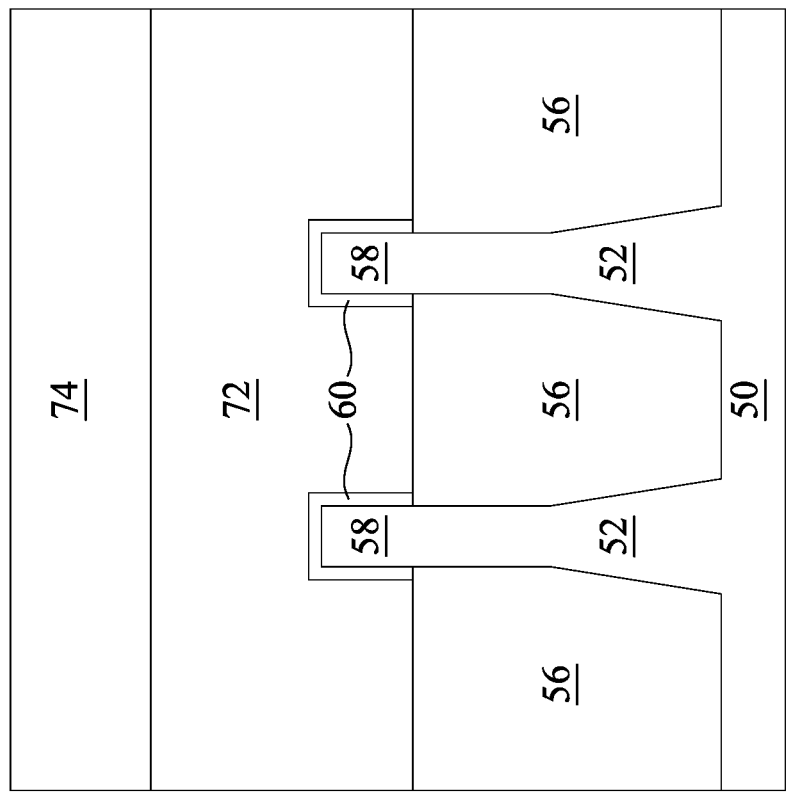
Figure 10D:
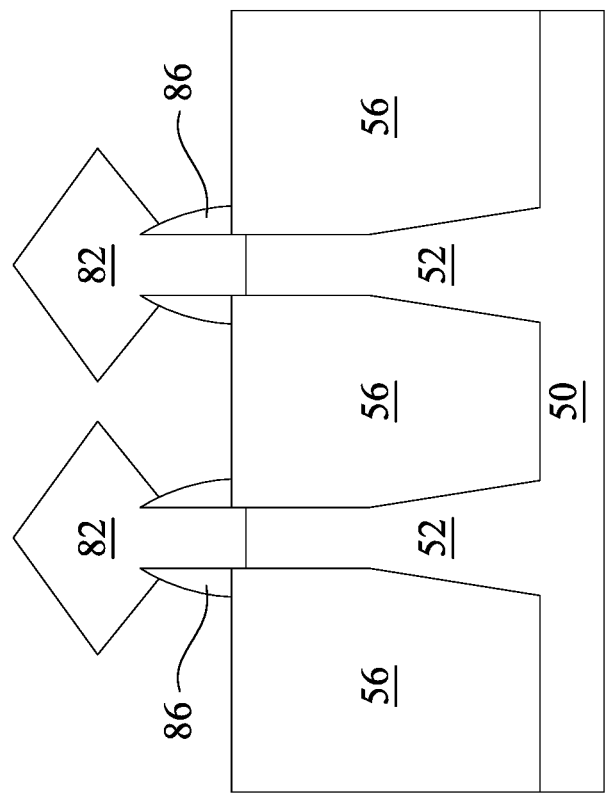
Figure 10C:
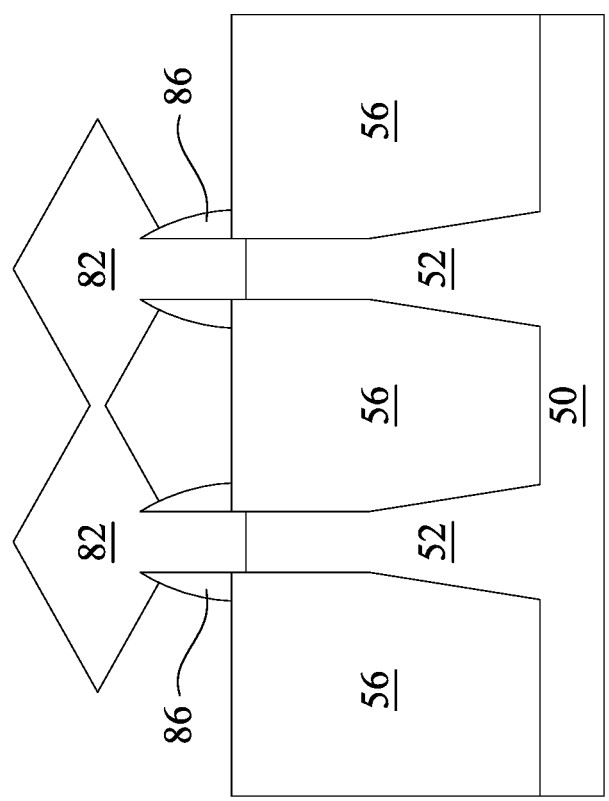

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 10A and 10B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D. In the embodiments illustrated in FIGS. 10C and 10D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 11B:
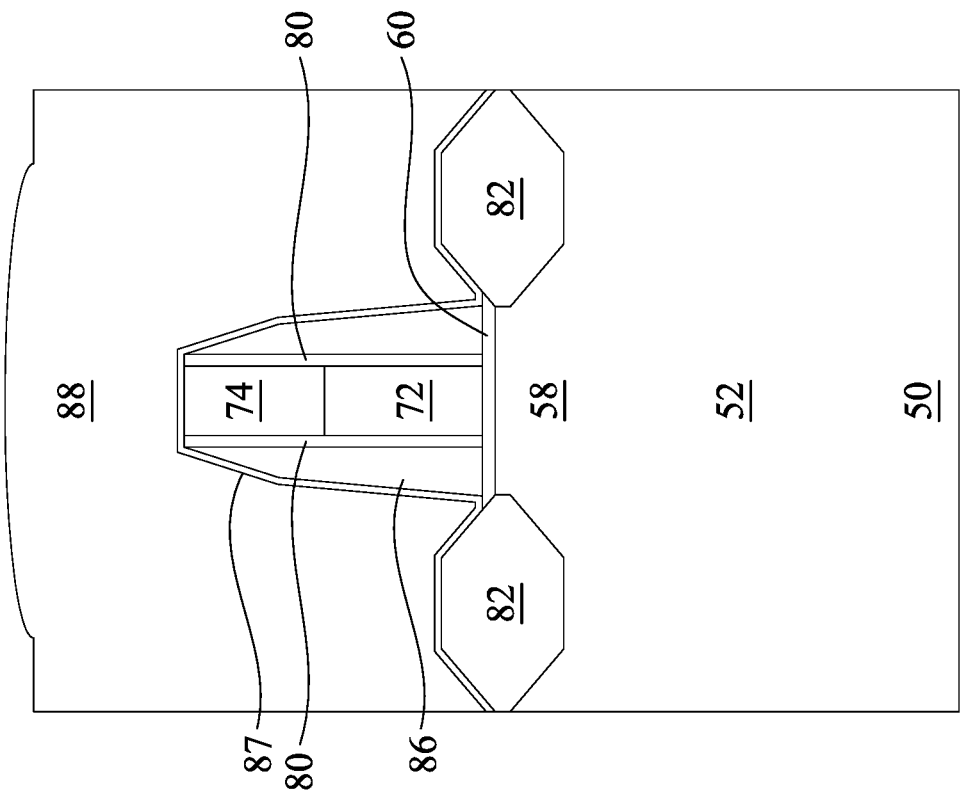
Figure 11A:
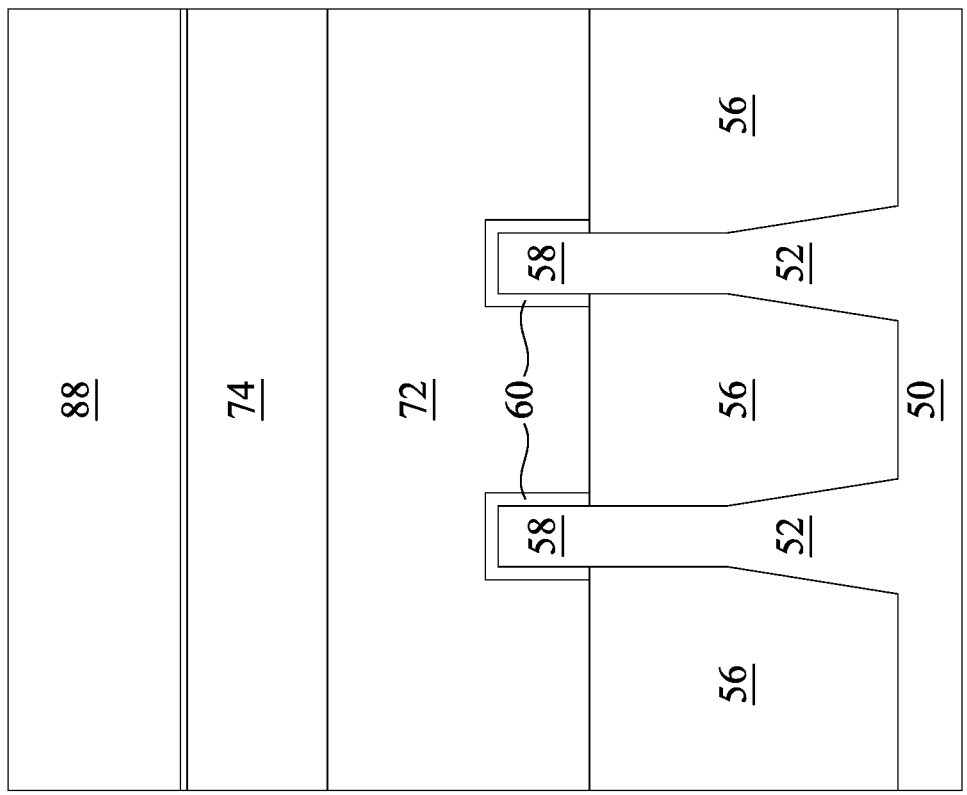

In FIGS. 11A and 11B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 12B:
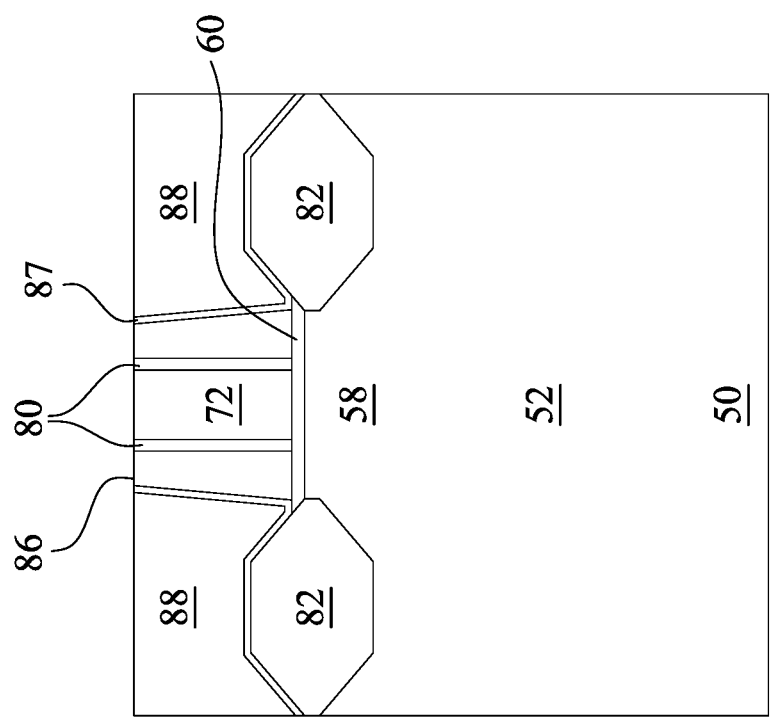
Figure 12A:
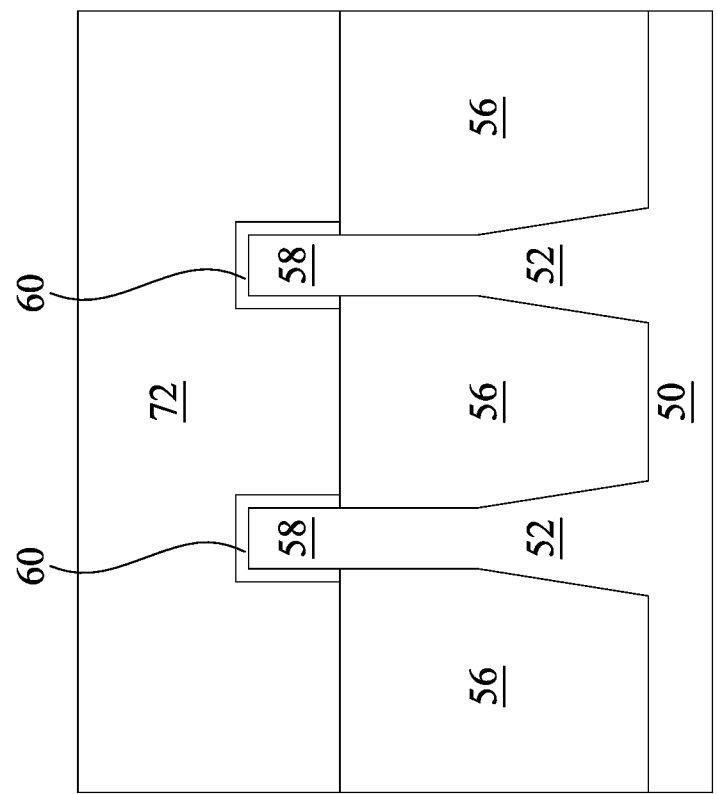

In FIGS. 12A and 12B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 13B:
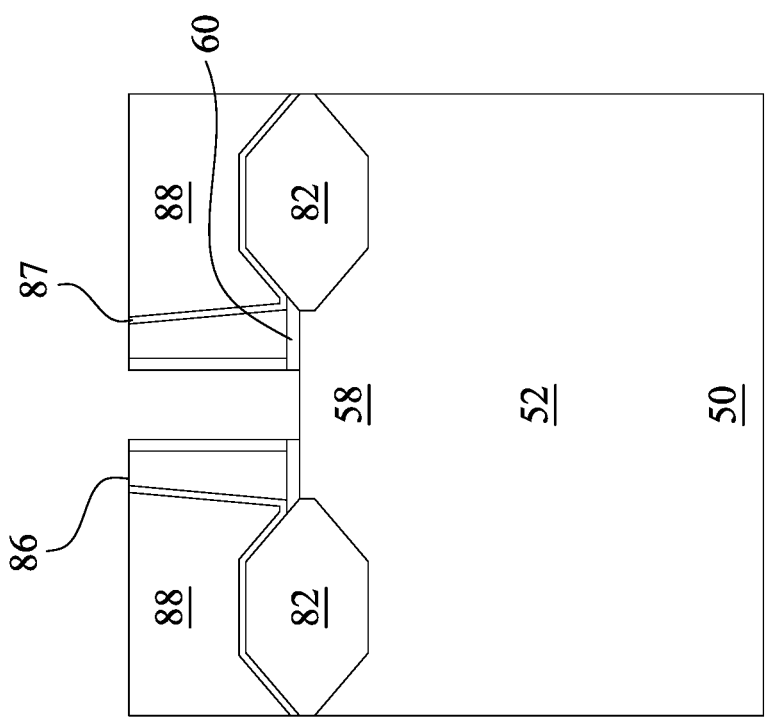
Figure 13A:
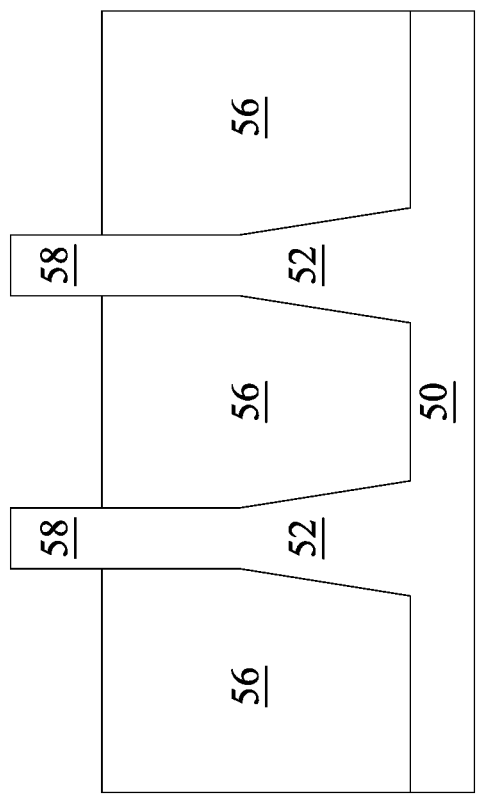

In FIGS. 13A and 13B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 14B:
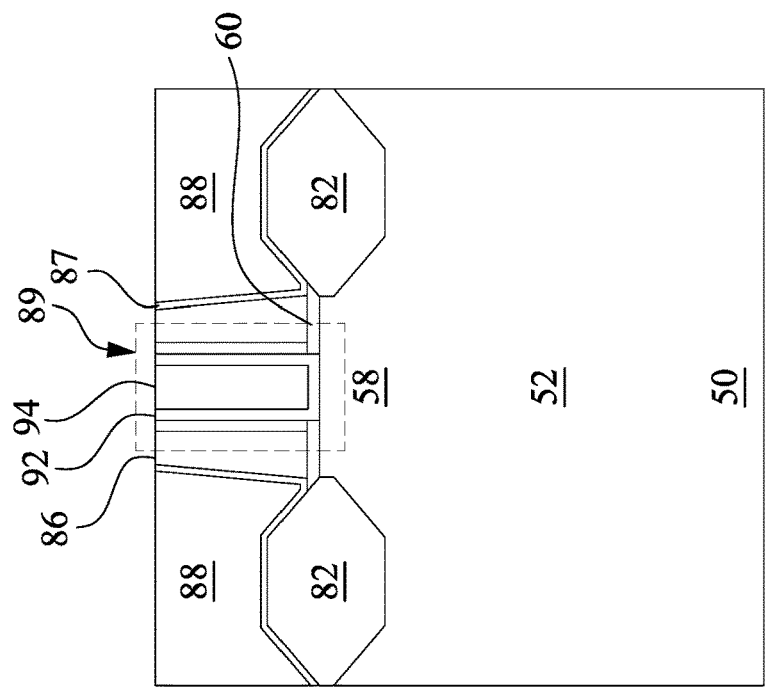
Figure 14A:
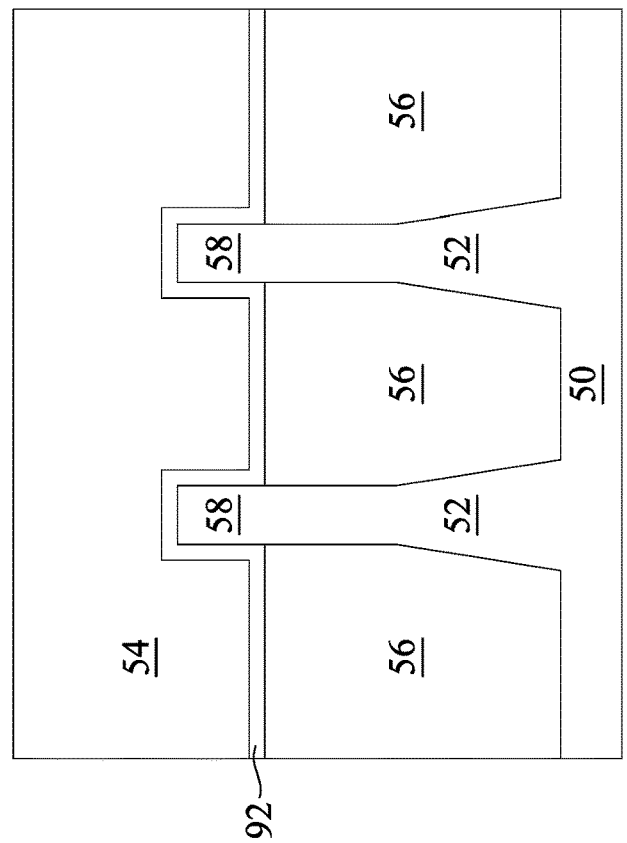
Figure 14C:
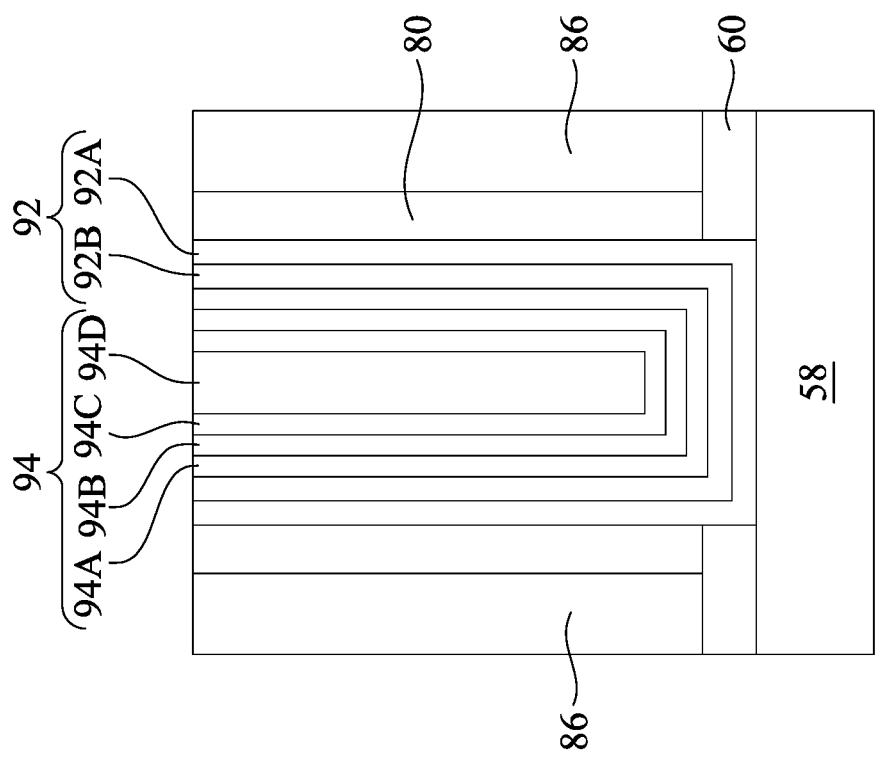

In FIGS. 14A and 14B, gate dielectric layers 92 and gate electrodes 94 are formed for replacement gates. FIG. 14C illustrates a detailed view of region 89 of FIG. 14B. Gate dielectric layers 92 may be one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer 92A, e.g., of silicon oxide formed by thermal or chemical oxidation, and an overlying high-k dielectric material 92B, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy gate dielectric 60 remain in the recesses 90, the gate dielectric layers 92 include a material of the dummy gate dielectric 60 (e.g., $SiO_2$).

The gate electrodes 94 are deposited over the gate dielectric layers 92 and fill the remaining portions of the recesses 90. The gate electrodes 94 may include a metal-containing material such as titanium nitride, titanium oxide, titanium carbo-nitride, tantalum nitride, tantalum carbide, tantalum carbo-nitride, titanium aluminum, cobalt, ruthenium, aluminum, tungsten, combinations thereof, or multi-layers thereof. For example, although a single layer gate electrode 94 is illustrated in FIG. 14B, the gate electrode 94 may comprise any number of p-type work function tuning layers 94A, any number of n-type work function tuning layers 94B, one or more glue layers 94C, and a fill material 94D as illustrated by FIG. 14C. In the n-type region 50N, the p-type work function tuning layers 94A may be removed prior to depositing the n-type work function tuning layer(s) 94B. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the liner layer 94A may be removed from the n-type region 50N prior to depositing the work function tuning layer(s) 94B. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

FIGS. 15A through 15D illustrate cross-sectional views of forming the gate electrodes 94 according to some embodiments. For ease of illustration, only a detailed view of the gate electrode (e.g., similar to the region 89 of FIGS. 14B and 14C) is illustrated for the p-type region 50P and the n-type region 50N.

Figure 15A:
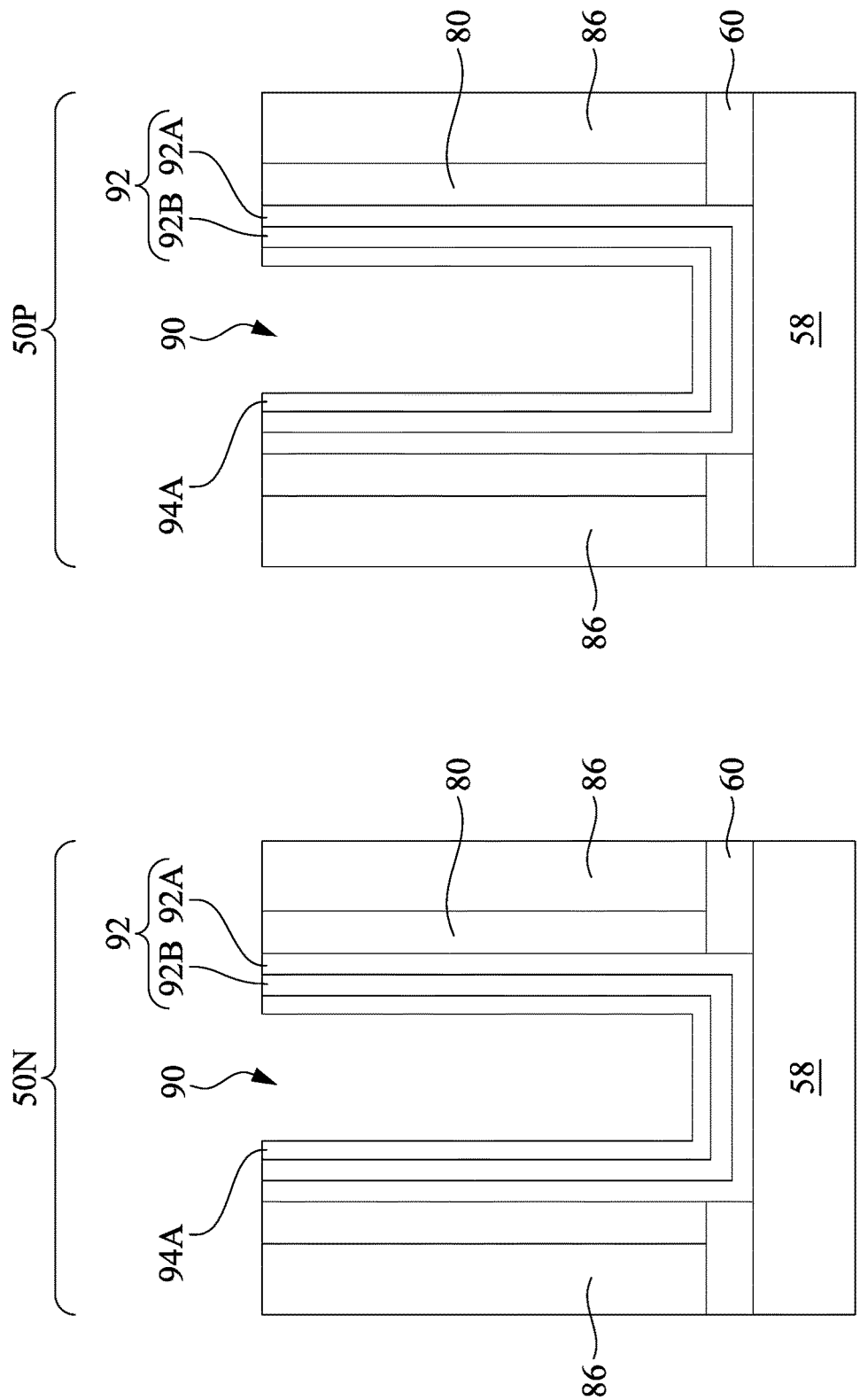
Figure 16A:
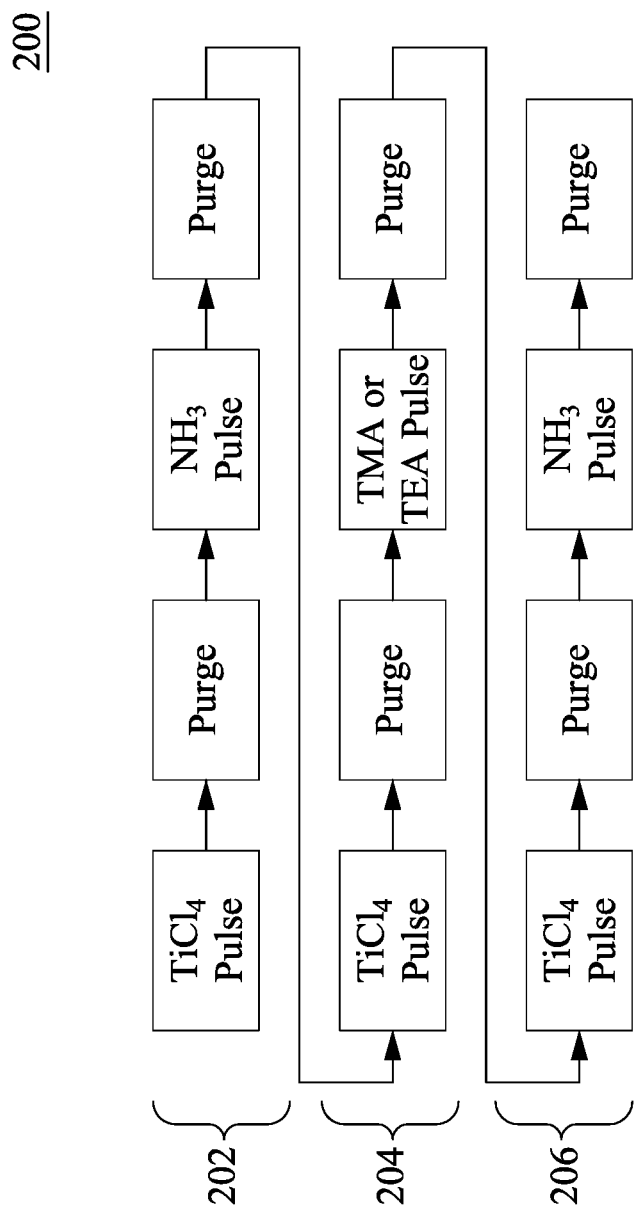
FIGS. 16A and 16B illustrate deposition processes, in accordance with some embodiments.

In FIG. 15A, a p-type work function tuning layer 94A is deposited in the recesses 90 in the p-type region 50P and the n-type region 50N. In some embodiments, the p-type work function tuning layer 94A comprises titanium carbon nitride (Ti—C—N), which is formed using an ALD process. FIG. 16A illustrates process flow of an embodiment ALD process 200 when the p-type type work function tuning layer 94A comprises Ti—C—N. The ALD process 200 may include deposition loops 202, 204, and 206, all of which are performed in a single process (e.g., in-situ within a same process chamber and without breaking vacuum). Each of the deposition loops 202, 204, and 206 may deposit at a rate in a range of 0.2 Å/loop to 8 Å/loop. In some embodiments, the ALD process 200 may be performed at a temperature in a range of 200° C. to 600° C. at a pressure of 0.5 Torr to 50 Torr.

The ALD process 200 begins with one or more deposition loops 202 to deposit one or more monolayers of a titanium nitride. Each deposition loop 202 includes pulsing a first titanium-comprising precursor (e.g., $TiCl_4$, or the like) into the ALD chamber, purging the ALD chamber, pulsing a second nitrogen-comprising precursor (e.g., $NH_3$) into the ALD chamber, and purging the ALD chamber. The titanium-comprising precursor reacts with the nitrogen-comprising precursor to deposit a monolayer of titanium nitride on exposed surfaces of the recesses 90. Each deposition loop 202 deposits a single monolayer of titanium nitride, and any number of deposition loops 202 may be performed to deposit a desired quantity of titanium nitride monolayers.

The ALD process 200 continues one or more deposition loops 204 to deposit one or more monolayers of a titanium carbide. Each deposition loop 204 includes pulsing the first titanium-comprising precursor (e.g., $TiCl_4$, or the like) into the ALD chamber, purging the ALD chamber, pulsing a third carbon-comprising precursor (e.g., trimethylaluminum (TMA), aluminum triethyl (TEA), or the like) into the ALD chamber, and purging the ALD chamber. The titanium-comprising precursor reacts with the carbon-comprising precursor to deposit a monolayer of titanium carbide on exposed surfaces of the recesses 90. Each deposition loop 204 deposits a single monolayer of titanium carbide, and any number of deposition loops 204 may be performed to deposit a desired quantity of titanium carbide monolayers.

Subsequently, the ALD process 200 continues with one or more deposition loops 206 to deposit one or more additional monolayers of a titanium nitride. Each deposition loop 206 includes pulsing the first titanium-comprising precursor (e.g., $TiCl_4$, or the like) into the ALD chamber, purging the ALD chamber, pulsing the second nitrogen-comprising precursor (e.g., $NH_3$) into the ALD chamber, and purging the ALD chamber. Similar to the deposition loops 202, the titanium-comprising precursor reacts with the nitrogen-comprising precursor to deposit a monolayer of titanium nitride on exposed surfaces of the recesses 90. Each deposition loop 206 deposits a single monolayer of titanium nitride, and any number of deposition loops 206 may be performed to deposit a desired quantity of titanium nitride monolayers over the titanium carbide monolayers.

Figure 16B:
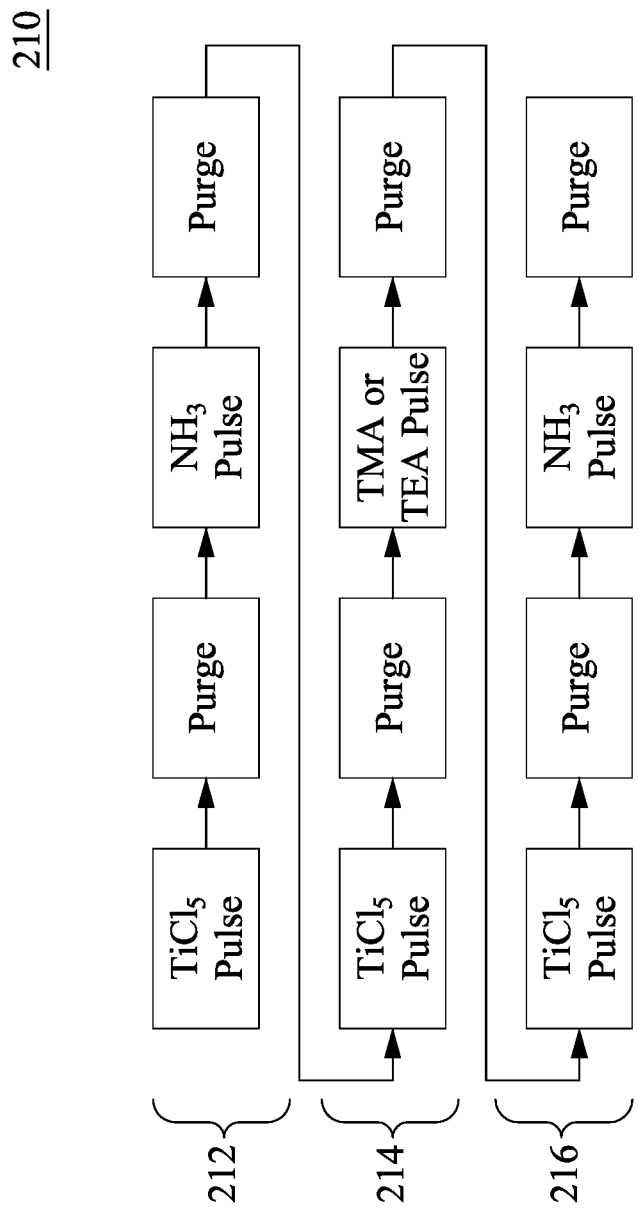

Alternatively, in some embodiments, the p-type work function tuning layer 94A comprises tantalum carbon nitride (Ta—C—N), which is formed using an ALD process. FIG. 16B illustrates process flow of an embodiment ALD process 210 when the p-type type work function tuning layer 94A comprises Ta—C—N. The ALD process 210 may include deposition loops 212, 214, and 216, all of which are performed in a single process (e.g., in-situ within a same process chamber and without breaking vacuum). Each of the deposition loops 212, 214, and 216 may deposit at a rate in a range of 0.2 Å/loop to 8 Å/loop. In some embodiments, the ALD process 210 may be performed at a temperature in a range of 200° C. to 600° C. at a pressure of 0.5 Torr to 50 Torr.

The ALD process 210 begins with one or more deposition loops 212 to deposit one or more monolayers of a tantalum nitride. Each deposition loop 202 includes pulsing a fourth tantalum-comprising precursor (e.g., $TaCl_5$, or the like) into the ALD chamber, purging the ALD chamber, pulsing the second nitrogen-comprising precursor (e.g., $NH_3$) into the ALD chamber, and purging the ALD chamber. The tantalum-comprising precursor reacts with the nitrogen-comprising precursor to deposit a monolayer of tantalum nitride on exposed surfaces of the recesses 90. Each deposition loop 212 deposits a single monolayer of tantalum nitride, and any number of deposition loops 212 may be performed to deposit a desired quantity of tantalum nitride monolayers.

The ALD process 210 continues one or more deposition loops 214 to deposit one or more monolayers of a tantalum carbide. Each deposition loop 214 includes pulsing the fourth tantalum-comprising precursor (e.g., $TaCl_5$, or the like) into the ALD chamber, purging the ALD chamber, pulsing the third carbon-comprising precursor (e.g., TMA, TEA, or the like) into the ALD chamber, and purging the ALD chamber. The tantalum-comprising precursor reacts with the carbon-comprising precursor to deposit a monolayer of titanium carbide on exposed surfaces of the recesses 90. Each deposition loop 214 deposits a single monolayer of tantalum carbide, and any number of deposition loops 214 may be performed to deposit a desired quantity of tantalum carbide monolayers.

Subsequently, the ALD process 210 continues with one or more deposition loops 216 to deposit one or more additional monolayers of a tantalum nitride. Each deposition loop 216 includes pulsing the fourth tantalum-comprising precursor (e.g., $TaCl_5$, or the like) into the ALD chamber, purging the ALD chamber, pulsing the second nitrogen-comprising precursor (e.g., $NH_3$) into the ALD chamber, and purging the ALD chamber. Similar to the deposition loops 212, the tantalum-comprising precursor reacts with the nitrogen-comprising precursor to deposit a monolayer of tantalum nitride on exposed surfaces of the recesses 90. Each deposition loop 216 deposits a single monolayer of tantalum nitride, and any number of deposition loops 216 may be performed to deposit a desired quantity of tantalum nitride monolayers over the tantalum carbide monolayers.

By adjusting the quantity of carbide deposition loops in the ALD process (e.g., loops 204 or 214 described above) and/or adjusting the quantity of nitrogen deposition loops in the ALD process (e.g., loops 202, 206, 212, and/or 216 described above), a ratio of carbon to nitrogen in the p-type work function tuning layer 94A can be adjusted such that a desired work function is achieved. For example, by increasing the number of carbide deposition loops in the ALD process, the ratio of carbon to nitrogen in the p-type work function tuning layer 94A can be increased. By depositing the p-type work function tuning layer 94A to have a relatively high ratio of carbon to nitrogen, a lower work function (e.g., more n-type) can be achieved. Further, by depositing the p-type work function tuning layer 94A to have a relatively low ratio of carbon to nitrogen, a higher work function (e.g., more p-type) can be achieved. In some embodiments, a ratio of carbon to nitrogen in the p-type work function tuning layer 94A is in a range of 0.05 to 0.95. In some embodiments, the ratio of carbon to nitrogen in the p-type work function tuning layer 94A is in a range of 0.05 to 0.55, which allows for precise tuning of work functions (and associated threshold voltages) of various transistors of the device. Thus, various embodiments provide a method for tuning a work function of a p-type work function tuning layer with improved precision.

Further, although only one p-type work function tuning layer is illustrated, it should be understood that some embodiments may include a semiconductor device having a first gate electrode and a second gate electrode with different p-type work function tuning layers. For example, the first gate electrode may include a first p-type work function tuning layer with a first carbon to nitrogen ratio, and the second gate electrode may include a second p-type work function tuning layer with a second carbon to nitrogen ratio. The first carbon to nitrogen ratio may be different than the second carbon to nitrogen ratio. The first and second p-type work function tuning layers may be selectively formed, for example, by masking recesses for each of the first and second gate electrodes as appropriate during deposition and/or etching of the first and/or second p-type work function tuning layers. In this manner, different types of gate electrodes may be formed with different p-type work function tuning layers, different work functions, and different threshold voltages based on circuit design. For example, in some embodiments, the first carbon to nitrogen ratio may be higher than the second carbon to nitrogen ratio, and as a result the first gate electrode may have a lower work function (e.g., a lower threshold voltage) than the second gate electrode.

Figure 15B:
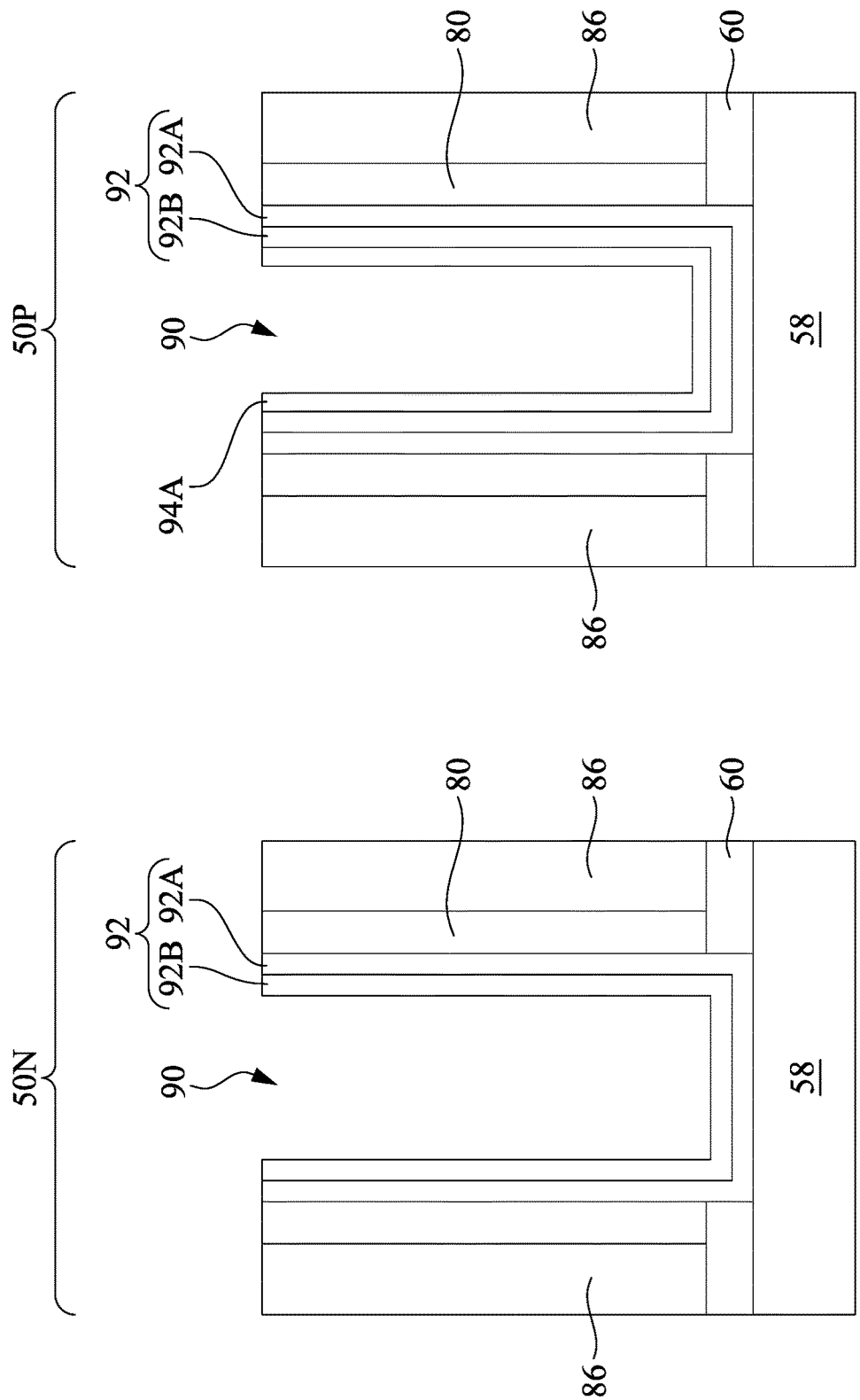

Referring to FIG. 15B, the processing may continue by removing the p-type work function tuning layer 94A from the recesses 90 in the n-type region 50N while leaving the p-type work function tuning layer 94A in the recesses 90 in the p-type region 50P. In some embodiments, the selective removal of the p-type work function tuning layer 94A from the n-type regions 50N may be achieved by masking the p-type work function tuning layer 94A in the p-type region 50P. For example, a mask (e.g., a back side anti-reflective (BARC) layer) may be deposited in the recesses 90 in the p-type region 50P to cover the p-type work function tuning layer 94A while an etching process is performed to remove the p-type work function tuning layer 94A from the n-type region 50N. After the etching process, the mask may then be removed.

Figure 15C:
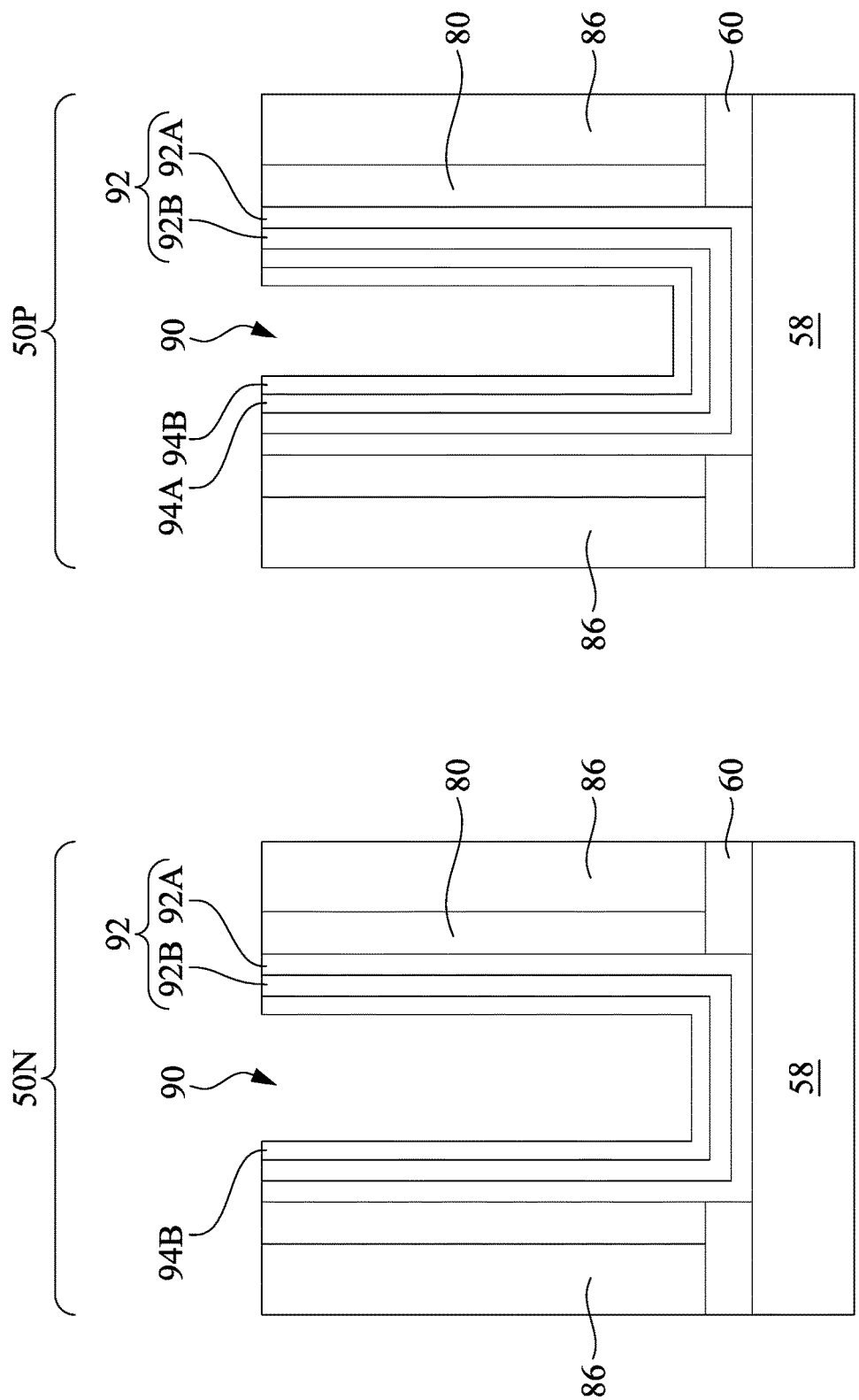

In FIG. 15C, an n-type work function tuning layer 94B is then formed conformally in the recesses 90 in the n-type region 50N and the p-type region 50P. Further, the n-type work function tuning layer 94B may be deposited over the p-type work function tuning layer 94C in the p-type region 50P. The n-type work function tuning layer 94B may be any acceptable material to tune a work function of a device to a desired amount given the application of the device to be formed, and may be deposited using any acceptable deposition process. In some embodiments, the n-type work function tuning layer 94B may comprise aluminum (Al), aluminum nitride (AlN), titanium aluminum (TiAl), tantalum aluminum (TaAl), or the like deposited by ALD, CVD, PVD, or the like.

Figure 15D:
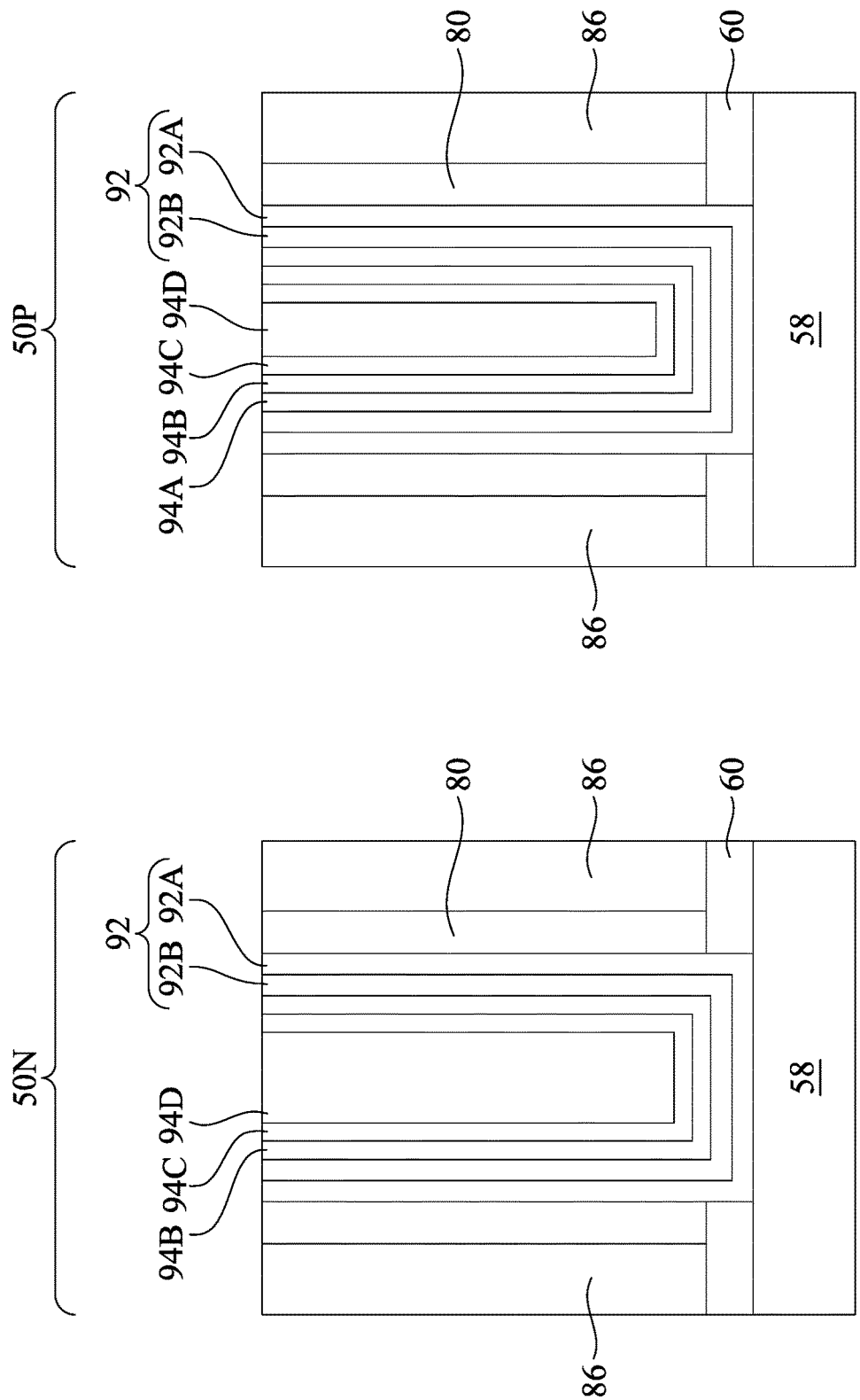

In FIG. 15D, an adhesion or glue layer 94C is formed conformally on the n-type work function tuning layer 94B in the n-type region 50N and the p-type region 50P. The glue layer 116 may comprise titanium nitride (TiN) or the like deposited by ALD or the like. Also in FIG. 15D, a conductive material 94D is deposited on the glue layer 94C. The conductive material D9 can include a metal, such as tungsten (W), aluminum (Al), cobalt (Co), ruthenium (Ru), combinations thereof or the like. The conductive material 94D can be deposited using CVD, PVD, the like, or a combination thereof. The conductive material 94D fills the remaining portions of the recesses 90.

After the conductive material 94D is deposited, a planarization process, such as a CMP, may be performed to remove the excess portions of gate dielectrics 92, the p-type work function tuning layer 94A, the n-type work function tuning layer 94B, the glue layer 94C, and the conductive material 94D, which excess portions are over the top surface of ILD 90, to form the gate dielectrics 92 and gate electrodes 94.

In FIGS. 15A and 15B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

Figure 17B:
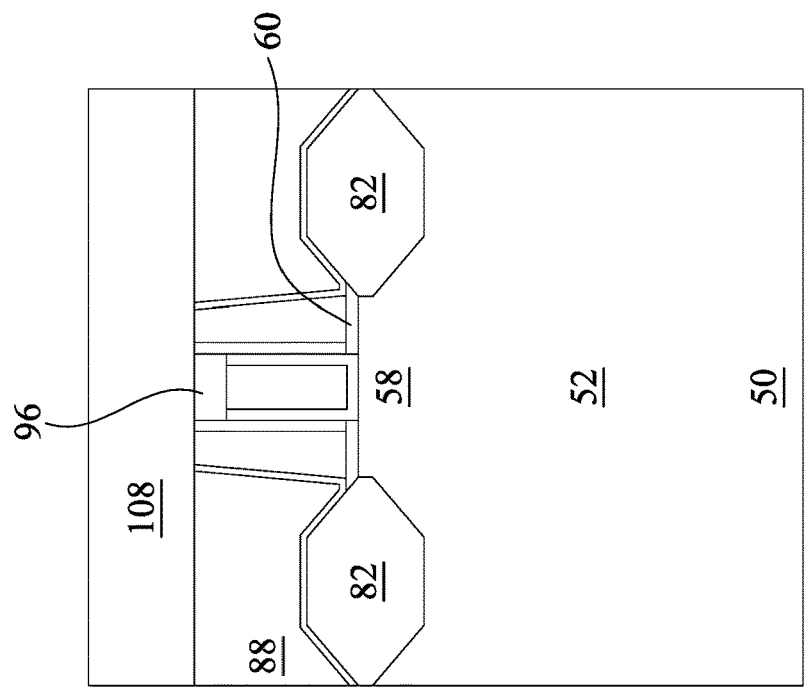
Figure 17A:
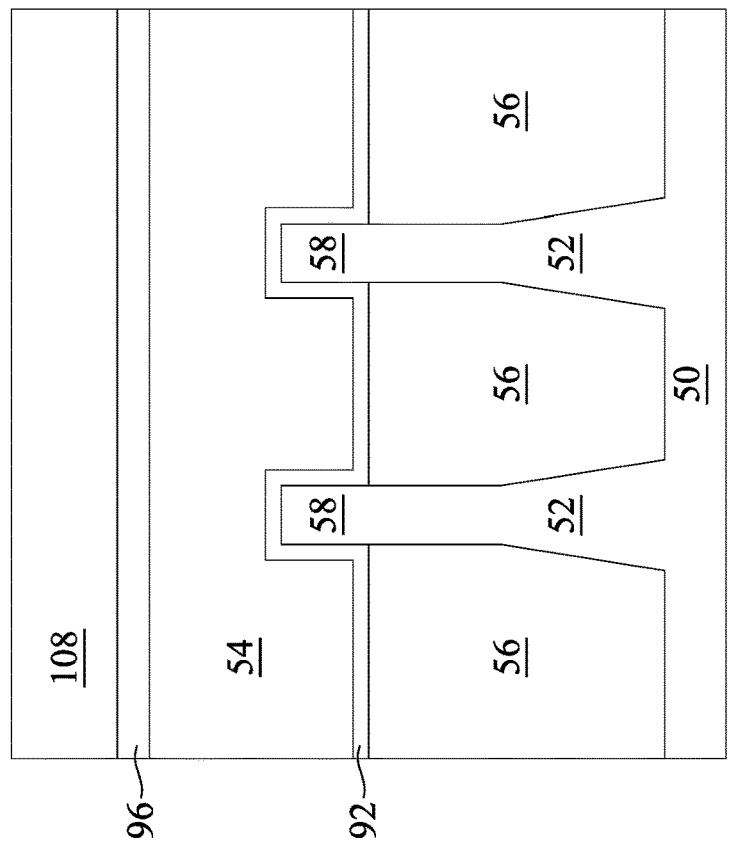

As also illustrated in FIGS. 17A and 17B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 18A and 18B) penetrate through the second ILD 108 and the gate mask 96 to contact the top surface of the recessed gate electrode 94.

Figure 18B:
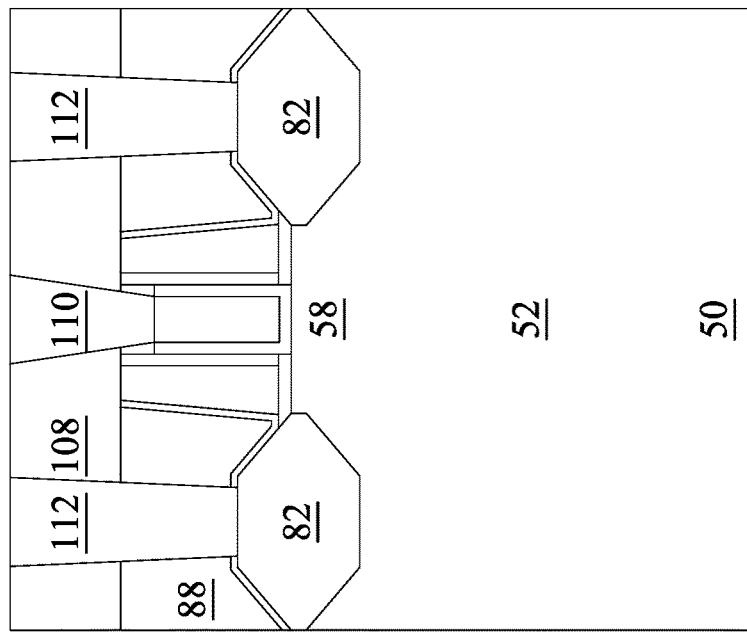
Figure 18A:
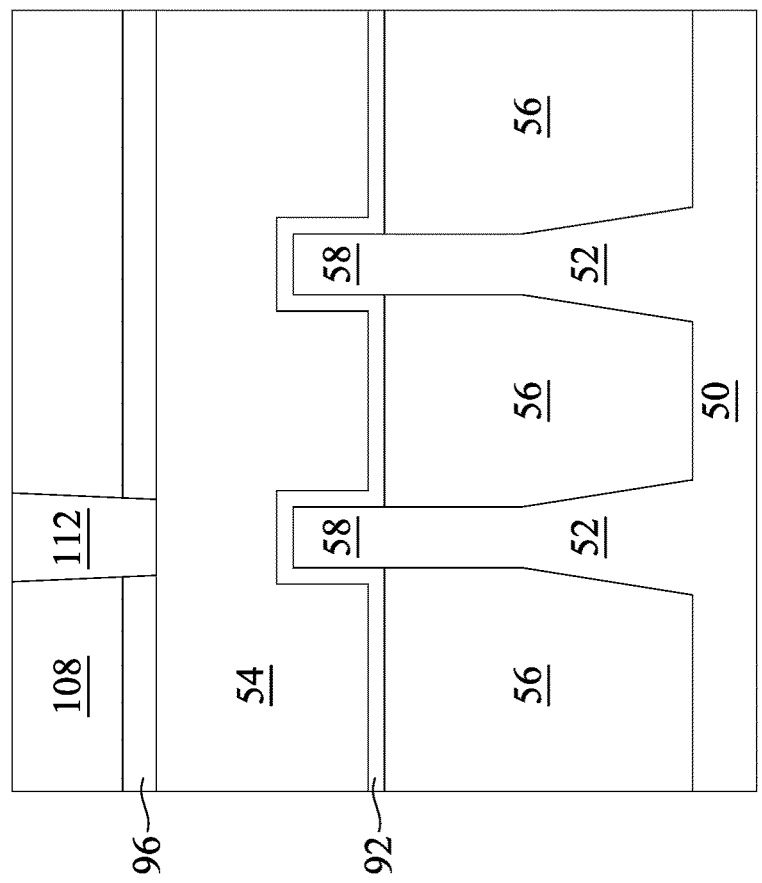

In FIGS. 18A and 18B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Patent Application Publication No. 2016/0365414, which is incorporated herein by reference in its entirety.

Various embodiments provide a method of depositing a WFM layer of a gate electrode for improved work function tuning. In some embodiments, the WFM layer is a p-type layer that is formed by an ALD process. The ALD process may deposit a combination of nitride monolayers (e.g., titanium nitride, tantalum nitride, or the like) and carbide monolayers (e.g., titanium carbide, tantalum carbide, or the like). By adjusting the ratio of a quantity of carbide monolayers to a quantity of nitride monolayers that are deposited, a work function of the gate electrode can be more precisely tuned. For example, a higher ratio carbon to nitrogen in the WFM layer may result in the WFM layer having a lower work function (e.g., more n-type), and a lower ratio of carbon to nitrogen in the WFM layer may result in the WFM layer having a higher work function (e.g., more p-type).

In some embodiments, a method for forming a gate electrode includes depositing a first work function tuning layer over a gate dielectric layer using an atomic layer deposition process, wherein the atomic layer deposition process comprises: depositing one or more first nitride monolayers; and depositing one or more carbide monolayers over the one or more first nitride monolayers; depositing an adhesion layer of the first work function tuning layer; and depositing a conductive material over the adhesion layer. Optionally, in some embodiments, depositing the one or more first nitride monolayers comprises: pulsing a metal-comprising precursor in a deposition chamber where the atomic layer deposition process is performed; and pulsing a nitrogen-comprising precursor in the deposition chamber. Optionally, in some embodiments, the metal-comprising precursor is $TiCl_4$, and the nitrogen-comprising precursor is $NH_3$. Optionally, in some embodiments, the metal-comprising precursor is $TaCl_5$, and the nitrogen-comprising precursor is $NH_3$. Optionally, in some embodiments, depositing the one or more carbide monolayers comprises: pulsing a metal-comprising precursor in a deposition chamber where the atomic layer deposition process is performed; and pulsing a carbon-comprising precursor in the deposition chamber. Optionally, in some embodiments, the metal-comprising precursor is $TiCl_4$, and wherein the carbon-comprising precursor is trimethylaluminum (TMA) or aluminum triethyl (TEA). Optionally, in some embodiments, the metal-comprising precursor is $TaCl_5$, and wherein the carbon-comprising precursor is trimethylaluminum (TMA) or aluminum triethyl (TEA). Optionally, in some embodiments, the atomic layer deposition process further comprises depositing one or more second nitride monolayers over the one or more carbide monolayers. Optionally, in some embodiments, the method further comprises prior to depositing the adhesion layer, depositing a second work function tuning layer on the first work function tuning layer. Optionally, in some embodiments, the first work function tuning layer is a p-type layer, and wherein the second work function tuning layer is an n-type layer.

In some embodiments, a method includes: forming a first recess between first gate spacers; depositing a p-type work function tuning layer in the first recess, wherein depositing the p-type work function tuning layer comprises: depositing first monolayers of a nitride; depositing second monolayers of a carbide over the first monolayers; and depositing third monolayers of the nitride over the second monolayers; depositing an n-type work function tuning layer in the first recess over the p-type work function tuning layer; depositing an adhesion layer in the first recess over the n-type work function tuning layer; and depositing a conductive fill material in the first recess over the adhesion layer. Optionally, in some embodiments, depositing the first monolayers and depositing the third monolayers comprises depositing tantalum-comprising monolayers. Optionally, in some embodiments, depositing the first monolayers and depositing the third monolayers comprises depositing titanium-comprising monolayers. Optionally, in some embodiments, the method further includes forming a second recess between second gate spacers; depositing the p-type work function tuning layer in the second recess; removing first portions of the p-type work function tuning layer from the second recess while masking second portions of the p-type work function tuning layer in the first recess; after removing the first portions of the p-type work function tuning layer, depositing the n-type work function tuning layer in the second recess; depositing the adhesion layer in the second recess over the n-type work function tuning layer; and depositing the conductive fill material in the second recess over the adhesion layer. Optionally, in some embodiments, depositing the second monolayers comprises flowing a carbon-comprising precursor, and wherein the carbon-comprising precursor is trimethylaluminum (TMA) or aluminum triethyl (TEA).

In some embodiments, a device includes a first source/drain region; a second source/drain region; and a first gate between the first source/drain region and the second source/drain region, the first gate comprising: a gate dielectric; and a gate electrode over the gate dielectric, the gate electrode comprising: a first p-type work function tuning metal over the gate dielectric, the first p-type work function tuning metal comprising carbon and nitrogen; an adhesive layer over the first p-type work function tuning metal; and a fill metal over the adhesive layer. Optionally, in some embodiments, the first p-type work function tuning metal further comprises titanium. Optionally, in some embodiments, the first p-type work function tuning metal further comprises tantalum. Optionally, in some embodiments, the device further includes an n-type work function tuning metal between the first p-type work function tuning metal and the adhesive layer. Optionally, in some embodiments, a ratio of carbon to nitrogen in the first p-type work function tuning metal is in a range of 0.05 to 0.55.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a gate electrode, the method comprising:
    forming a recess between a first gate spacer and a second gate spacer;
    depositing a gate dielectric layer in the recess;
    performing an atomic layer deposition process to deposit a p-type work function tuning layer over the gate dielectric layer, wherein the p-type work function tuning layer comprises carbon and nitrogen, wherein the performing the atomic layer deposition process comprises:
    depositing one or more first nitride monolayers;
    depositing one or more carbide monolayers over and in physical contact with the one or more first nitride monolayers; and
    depositing one or more second nitride monolayers over and in physical contact with the one or more carbide monolayers, wherein the one or more first nitride monolayers, the one or more carbide monolayers, and the one or more second nitride monolayers are all deposited in situ with each other;
    depositing an adhesion layer of the p-type work function tuning layer; and
    depositing a conductive fill material over the adhesion layer.

2. The method of claim 1, wherein depositing the one or more first nitride monolayers comprises:

pulsing a metal-comprising precursor in a deposition chamber where the atomic layer deposition process is performed;

purging the metal-comprising precursor; and pulsing a nitrogen-comprising precursor in the deposition chamber.

3. The method of claim 2, wherein the metal-comprising precursor is $TiCl_4$, and the nitrogen-comprising precursor is $NH_3$.

4. The method of claim 2, wherein the metal-comprising precursor is $TaCl_5$, and the nitrogen-comprising precursor is $NH_3$.

5. The method of claim 1, wherein depositing the one or more carbide monolayers comprises:

pulsing a metal-comprising precursor in a deposition chamber where the atomic layer deposition process is performed;

purging the metal-comprising precursor; and pulsing a carbon-comprising precursor in the deposition chamber.

6. The method of claim 5, wherein the metal-comprising precursor is $TiCl_4$, and wherein the carbon-comprising precursor is trimethylaluminum (TMA) or aluminum triethyl (TEA).

7. The method of claim 5, wherein the metal-comprising precursor is $TaCl_5$, and wherein the carbon-comprising precursor is trimethylaluminum (TMA) or aluminum triethyl (TEA).

8. The method of claim 1, wherein the method further comprises prior to depositing the adhesion layer, depositing an n-type work function tuning layer on the p-type work function tuning layer.

9. The method of claim 1, wherein the one or more carbide monolayers comprise TiC.

10. The method of claim 1, wherein the one or more first nitride monolayers comprises TiN.

11. A method comprising:

forming a first recess between first gate spacers;

depositing a p-type work function tuning layer comprising TiCN in the first recess, wherein depositing the p-type work function tuning layer comprises:

depositing one or more first nitride monolayers;

depositing one or more carbide monolayers on the one or more first nitride monolayers; and depositing one or more second nitride monolayers on the one or more carbide monolayers;

and depositing an adhesion layer in the first recess over the p-type work function tuning layer; and depositing a conductive fill material in the first recess over the adhesion layer.

12. The method of claim 11, wherein depositing one or more nitride monolayers comprises depositing tantalum-comprising monolayers.

13. The method of claim 11, wherein depositing the one or more first nitride monolayers comprises depositing titanium-comprising monolayers.

14. The method of claim 11 further comprising before depositing the adhesion layer, depositing an n-type work function tuning layer in the first recess over the p-type work function tuning layer.

15. The method of claim 14, further comprising:

forming a second recess between second gate spacers;

depositing the p-type work function tuning layer in the second recess;

removing first portions of the p-type work function tuning layer from the second recess while masking second portions of the p-type work function tuning layer in the first recess; and after removing the first portions of the p-type work function tuning layer, depositing the n-type work function tuning layer in the second recess.

16. A device comprising:

a semiconductor fin extending from a semiconductor substrate;

a source/drain region extending into the semiconductor fin, wherein an interlayer dielectric is disposed along sidewalls of an upper portion of the source/drain region;

a first gate in the interlayer dielectric and adjacent to the source/drain region, the first gate comprising:

a gate dielectric; and a p-type work function tuning metal over the gate dielectric, the p-type work function tuning metal comprising carbon and nitrogen;

an n-type work function tuning metal over the p-type work function tuning metal;

an adhesive layer over the n-type work function tuning metal; and a fill metal over the adhesive layer, wherein the n-type work function tuning metal and the adhesive layer are each disposed between the fill metal and the p-type work function tuning metal.

17. The device of claim 16, wherein the p-type work function tuning metal further comprises titanium.

18. The device of claim 16, wherein the p-type work function tuning metal further comprises tantalum.

19. The device of claim 16, wherein a ratio of carbon to nitrogen in the p-type work function tuning metal is in a range of 0.05 to 0.55.

20. The device of claim 16, wherein the p-type work function tuning metal comprises TiCN.

* * * * *